United States Patent
Sri-Jayantha et al.

(10) Patent No.: US 7,759,787 B2
(45) Date of Patent: Jul. 20, 2010

(54) PACKAGING SUBSTRATE HAVING PATTERN-MATCHED METAL LAYERS

(75) Inventors: Sri M. Sri-Jayantha, Ossining, NY (US); Hien P. Dang, Nanuet, NY (US); Vijayeshwar D. Khanna, Millwood, NY (US); Arun Sharma, New Rochelle, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 11/935,834

(22) Filed: Nov. 6, 2007

(65) Prior Publication Data

US 2009/0114429 A1 May 7, 2009

(51) Int. Cl.
*H01L 23/053* (2006.01)
*H01L 23/12* (2006.01)

(52) U.S. Cl. .............. 257/700; 257/701; 257/702; 257/E23.175

(58) Field of Classification Search .......... 257/700, 257/701, 702, E23.175; 361/777
See application file for complete search history.

(56) References Cited

U.S. PATENT DOCUMENTS

| | | | |
|---|---|---|---|
| 4,963,697 A * | 10/1990 | Peterson et al. ............ 174/252 |
| 5,451,721 A * | 9/1995 | Tsukada et al. ............ 174/261 |
| 6,217,987 B1 * | 4/2001 | Ono et al. .................. 428/209 |
| 6,376,049 B1 * | 4/2002 | Asai et al. ................. 428/209 |
| 6,392,898 B1 * | 5/2002 | Asai et al. ................. 361/794 |
| 6,410,858 B1 * | 6/2002 | Sasaki et al. .............. 174/255 |
| 6,411,519 B2 * | 6/2002 | Asai et al. ................. 361/794 |
| 6,591,495 B2 * | 7/2003 | Hirose et al. ............... 29/846 |
| 7,535,095 B1 * | 5/2009 | En et al. ................... 257/701 |

* cited by examiner

*Primary Examiner*—Nitin Parekh
(74) *Attorney, Agent, or Firm*—Scully, Scott, Murphy & Presser, P.C.; Daniel P. Morris, Esq.

(57) ABSTRACT

A pattern matched pair of a front metal interconnect layer and a back metal interconnect layer having matched thermal expansion coefficients are provided for a reduced warp packaging substrate. Metal interconnect layers containing a high density of wiring and complex patterns are first developed so that interconnect structures for signal transmission are optimized for electrical performance. Metal interconnect layers containing a low density wiring and relatively simple patterns are then modified to match the pattern of a mirror image metal interconnect layer located on the opposite side of the core and the same number of metal interconnect layer away from the core. During this pattern-matching process, the contiguity of electrical connection in the metal layers with a low density wiring may become disrupted. The disruption is healed by an additional design step in which the contiguity of the electrical connection in the low density is reestablished.

21 Claims, 14 Drawing Sheets

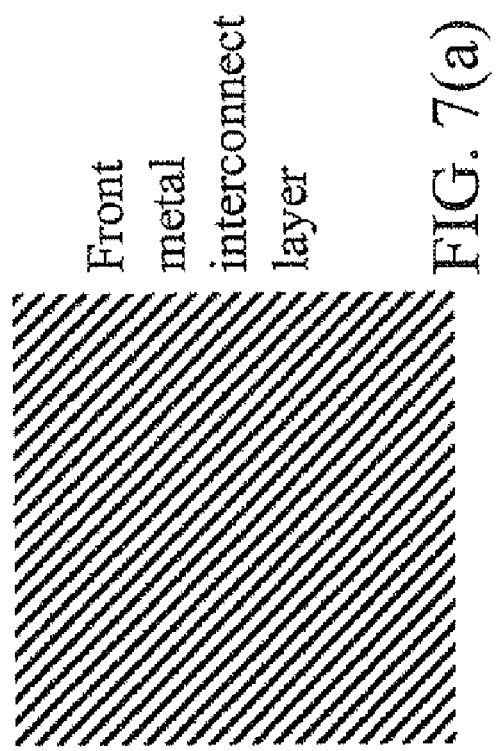
FIG. 7(a) Front metal interconnect layer
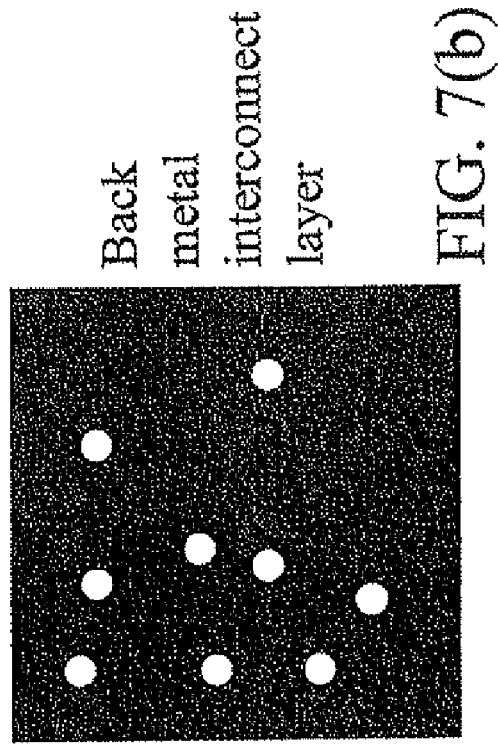
FIG. 7(b) Back metal interconnect layer
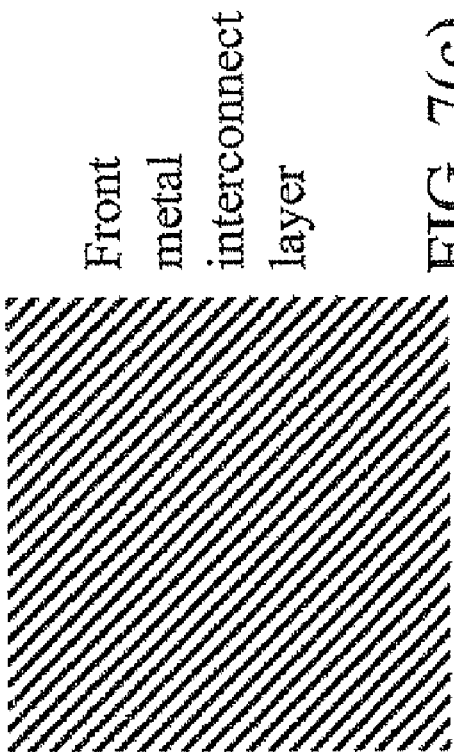
FIG. 7(c) Front metal interconnect layer
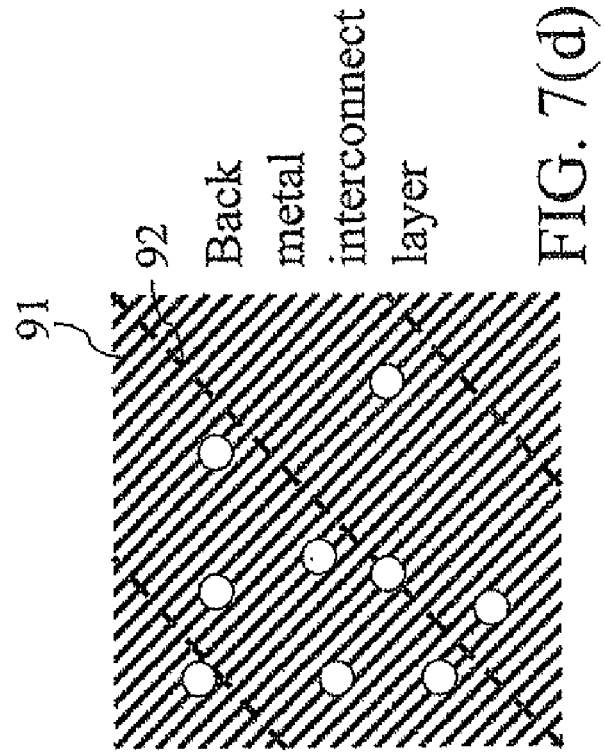
FIG. 7(d) Back metal interconnect layer

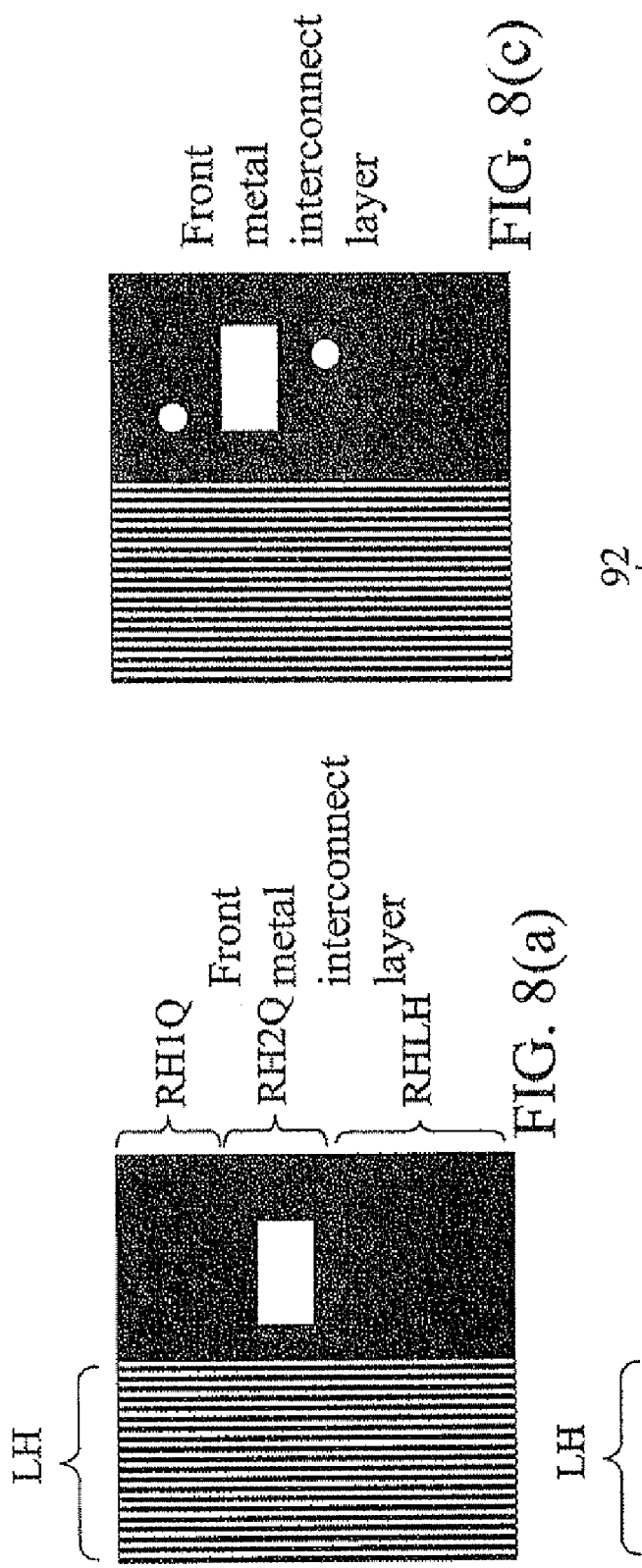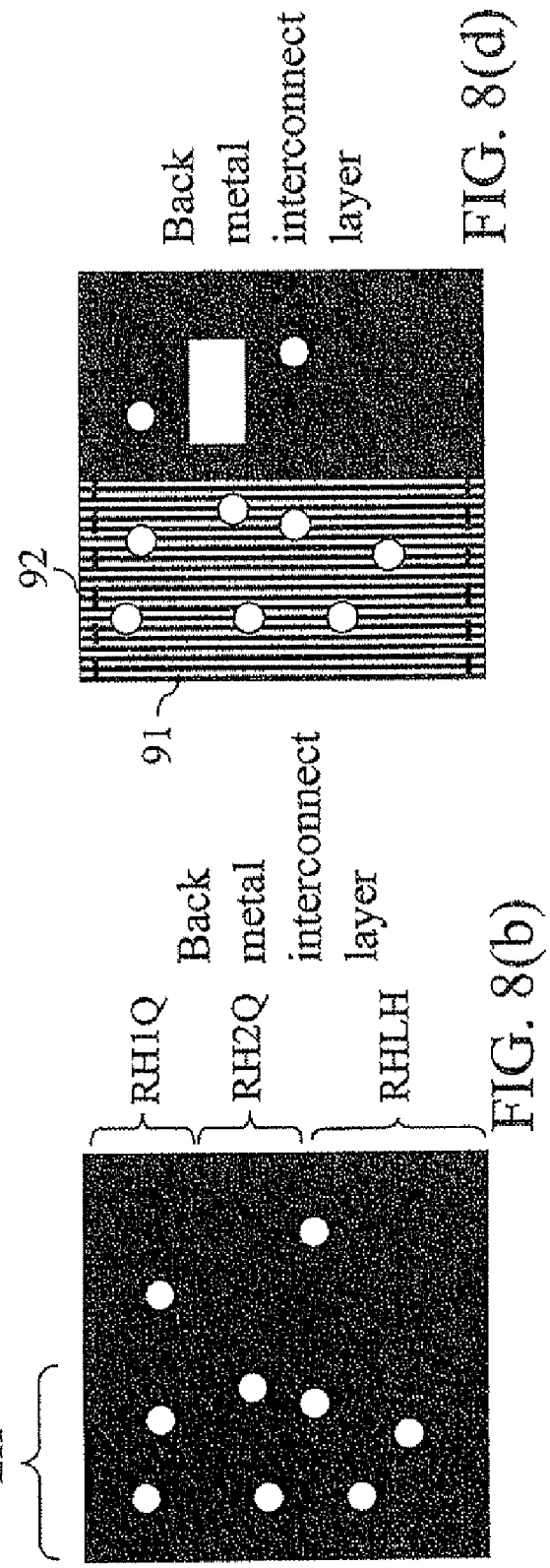
FIG. 8(a)
FIG. 8(b)
FIG. 8(c)
FIG. 8(d)

PACKAGING SUBSTRATE HAVING PATTERN-MATCHED METAL LAYERS

FIELD OF THE INVENTION

The present invention relates to semiconductor structures, and particularly to packaging substrates having pattern-matched metal layers, methods of manufacturing the same, and methods of generating matched patterns for metal layers for the same.

BACKGROUND OF THE INVENTION

Once formation of semiconductor devices and interconnects on a semiconductor wafer (substrate) is completed, the semiconductor wafer is diced into semiconductor chips, or "dies." Functional semiconductor chips are then packaged to facilitate mounting on a circuit board. A package is a supporting element for the semiconductor chip that provides mechanical protection and electrical connection to an upper level assembly system such as the circuit board. Two types of packaging technologies are commonly available. The first type is wire bonding that employs bonding pads and solder bumps on the semiconductor chip and on a wirebond package. Bonding wires connect pairs of bonding pads across the semiconductor chip and the wirebond package to provide electrical connection between them. The second type is Controlled Collapse Chip Connection (C4) packaging, which employs C4 balls each of which contacts a C4 pads on the semiconductor chip and another C4 pad on a packaging substrate. Both types of packaging technologies provide a packaged semiconductor chip which may be assembled on the circuit board.

Typically, a semiconductor chip having a large number of input/output (I/O) pins employ C4 packaging since C4 packaging can handle higher density of pins than wire bonding packages. FIG. 1 shows a prior art packaging substrate comprising a core 50 at the center, multiple vertically stacked front metal interconnect layers 20' located above the core 50, multiple front insulator layers 30 interspersed between the front metal interconnect layers 20' and above the core 50, multiple vertically stacked back metal interconnect layers 80', and multiple back insulator layers 70 interspersed between the back metal interconnect layers 80'. Each of the front insulator layers 30 provides electrical isolation between a pair of neighboring front metal interconnect layers 20'. Likewise, each of the back insulator layers 70 provides electrical isolation between a pair of neighboring back metal interconnect layers 80'. Typically, the number of front metal interconnect layers 20' matches the number of the back metal interconnect layers 80'.

The packaging substrate facilitates formation of electrical link between the semiconductor chip and a system board of a computer. A semiconductor chip is mounted on a die foot print area 12 located on a top surface of the packaging substrate. The die foot print area 12 contains C4 pads on which a semiconductor chip (not shown) may be attached by C4 bonding. The area of the top surface of the packaging substrate outside of the die foot print area 12 is referred to as a packaging substrate top surface 10.

A typical semiconductor chip employing a packaging substrate may comprise about 5,000 input/output nodes. Each of these nodes are electrically connected to a C4 pad on a top surface of the semiconductor chip in a two dimensional array. Typical two dimensional array configurations for the C4 pads include 4 on 8 configuration, which employs C4 solder balls having a diameter of 4 mils (~100 microns) and a pitch of 8 mils (~200 microns) in a rectangular array, and 3 on 6 configuration, which employs C4 solder balls having a diameter of 3 mils (~75 microns) and a pitch of 6 mils (~150 microns) in a rectangular array. Thus, more than 5,000 C4 solder balls may be formed on the semiconductor chip, which may be typically about 2 cm×2 cm in size.

The front metal interconnect layers 20' and the back metal interconnect layers 80' provide electrical connections from the C4 pads on the die foot print area 12 to the bottom of the packaging substrate which contains ball grid array (BGA) pads having a larger dimension than the C4 pads. Typically, BGA pads are in a rectangular array having a pitch on the order of about 1 mm. BGA solder balls having a diameter of about 400 microns are used to attach the packaging substrate to the system board. Typically, Sn—Ag—Cu alloys, which are free of lead, is employed to meet emerging standards for reducing hazardous materials. An alternative method to BGA connection is to employ land grid array (LGA) in which a thin pad containing metal points in a grid are placed between the system board and the substrate. Use LGA facilitates easy removal of a substrate containing expensive electronics for repair purposes.

The packaging substrate also protects the semiconductor chip that is mounted on the die foot print area 12 and modularizes the product development of the semiconductor chip, while simplifying the subsequent integration steps involved in the manufacturing of a larger computer or a consumer electronic product. Ceramic materials or organic materials may be employed for building up a substrate. Ceramic substrates are built layer by layer without the need of a core whereas an organic substrates requires a core on which the front and back layers can be built. While ceramic materials offer excellent mechanical strength and a low level of warp relative to organic materials, there is an inherent limitation in wiring density posed by ceramic substrate. It necessarily requires larger number of buildup layers (by a factor of 5 to 10) than that required by a an organic substrate In contrast, an organic substrate facilitates high density wiring in the front metal interconnect layers 20' and the back metal interconnect layers 80', i.e., a packaging substrate employing an organic material for the core 50, the top insulator layers 30, and the bottom insulator layers 80. Typically, approximately 16 levels of the front metal interconnect layers 20' and the back metal interconnect layers 80' may accommodate the contents of the electrical wiring in 100 levels in a ceramic package.

The present trend in substrate technology is to transition from ceramic packaging substrates to organic packaging substrates. An organic packaging substrate, i.e., an organic polymer based electronic packaging substrate is a cost effective means to fan out the input/output pads and power supply pads from a semiconductor chip having a large number of pads or pads arranged in a high density. Presence of core 50 in an organic package degrades the electrical parameters of the interconnects as signals have to travel through larger inductive and resistive links called plated through holes. In order to enhance the electrical performance the industry has interest in reducing the core thickness to near 100 um thick if not completely becoming a coreless substrate. Furthermore to reduce the thermal expansion sensitivity, materials for the core 50 having a lower coefficient of thermal expansion (CTE) are being pursued by the packaging industry. Even though the quest for low-CTE materials revolves around organic resins with filled particles, use of silicon or ceramic as the core material can not be overlooked.

The core 50 of an organic packaging substrate is made of fiber reinforced organic or resin material having a thickness from about 400 microns to about 800 microns. The lateral dimensions of the core 50 depends on the number of C4 pads on the semiconductor chip that is attached to the die foot print area 12, and may be from about 3 cm to about 7.5 cm. The front metal interconnect layers 20' and the back metal interconnect layers 80' are progressively built layer by layer on the top and the bottom of the core 50, respectively, by a series of processing steps. Each of the front metal interconnect layers 20' and the back metal interconnect layers 80' may be employed for circuit interconnection of input/output nodes, distribution of a power supply network, or distribution of a ground network. The processing steps typically involve electroless-plating, electroplating, etching, polishing, placement of dielectric resin, high temperature pressing of resin, etc. Typical temperature of the high temperature pressing of resin is about 200° C. Each of the front metal interconnect layers 20' and the back metal interconnect layers 80' is separated by a sheet of photosensitive resin. Laser drilling of the resin and electroplating process are used to fabricate vias that provide electrical connection between neighboring pairs of various metal interconnect layers (20', 80'). Multi-stack vias are used to link the various metal interconnect layers (20', 80') that are further apart.

The front metal interconnect layers 20' and the top insulator layers 30 are collectively called front circuit build-up layers. The back metal interconnect layers 80' and the bottom insulator layers 70 are collectively called bottom circuit build-up layers. Since each of the various metal interconnect layers (20', 80') is designed to optimize electrical performance, the mechanical characteristics of each of the various metal interconnect layers (20', 80') are not precisely controlled.

FIGS. 2A and 2B show exemplary patterns of a pair of a top metal interconnect layer 20' and a bottom metal interconnect layer 80'. Specifically, FIG. 2A shows an exemplary pattern of a top metal interconnect layer 20' in which areas of the metal are represented by black areas and areas of a dielectric material, which is an organic or resin material, are represented by white areas. FIG. 2B shows an exemplary pattern of a bottom metal interconnect layer 80' in which areas of the metal are represented by black areas and areas of the dielectric material are represented by white areas. On one hand, the top metal interconnect layers 20' generally include dense interconnect structures made of metal lines, typically etched from a layer of metal deposited by means of a plating process. The metal may comprise Cu, Ag, Au, or Ni, and typically comprises Cu. The dense interconnect structures require a relatively high percentage of area used for electrical insulation between adjacent metal lines. Thus, the percentage of areas of the metal is relatively low, and may typically be from about 10% to about 60%. On the other hand, the bottom metal interconnect layers 80' tend to have a continuous sheet of metal with distributed holes for vias to pass through so that the vias may be connected to BGA pads on the bottom surface of the packaging substrate. The continuous sheet of metal may comprise Cu, Ag, Au, or Ni, and typically comprises Cu. The continuous sheet of metal uses a relatively high percentage of area for metal areas. Thus, percentage of areas of the metal is relatively high, and may typically be from about 40% to about 99%. Such a configuration inevitably leads to a substrate with asymmetric thermomechanical properties when viewed with respect to the plane of symmetry at the center of the core 50.

In general, a packaging substrate design with asymmetric thermomechanical parameters produces a warp when it is constructed at a high temperature and cooled down to the room temperature. Electronic manufacturing and assembly operations incorporating a packaging substrate require a warp less than a maximum acceptable level. For example, for a packaging substrate having a 55 mm×55 mm square cross-sectional area, a warp up less than 100 μm is considered acceptable. While the maximum acceptable level for the warp of a packaging substrate may vary depending on the number of front circuit build-up layers and back circuit build-up layers as well as the lateral dimensions of the packaging substrate, size of the semiconductor chip, and the thickness of the core 50, less warp is preferred since a high level of warp makes alignment and reflow of BGA solder balls difficult as well as applying a mechanical stress to C4 solder balls and compromise integrity of C4 bonding. Thus, the yield of packaging substrates may be reduced if excessive warp is introduced into the packaging substrate.

FIG. 3 shows the measured warp (corrected for initial warp at high temperature) of 12 samples of an organic packaging substrate having a 55 mm×55 mm size. A warp curve 150 shows the mean of the warp as a function of distance from a corner of each sample toward a diagonal corner of the sample. The direction of the measurement of the warp is shown in FIG. 1 by an arrow labeled "d." An average warp range of about 50 μm is observed in the data from the samples. In addition, the range of the warp is not constant throughout the samples. There is a statistical distribution in the warp as a function of the distance along the diagonal of the packaging substrate. A +3 sigma warp curve 153, which is obtained by adding three times the standard variation of the 12 measured values for each distance along the diameter to the mean warp curve 150, and a −3 sigma warp curve 147, which is obtained by subtracting three times the standard variation of the 12 measured values for each distance along the diameter to the mean warp curve 150, are also shown. Statistically, 99.73% of the organic packaging substrates manufactured with the same method are expected to have less warp than the +3 sigma warp curve 153 assuming the warp is distributed according to a Gaussian probability function. In other words, 0.27% of the organic packaging substrates manufactured with the same method are expected to have more warp than the +3 sigma warp curve 153. In reality the warp distribution is more skewed towards higher warp, and the 3-sigma factor may need to be modified accordingly to cover 99.73% target. Clearly, organic packaging substrates that have unacceptable level of warp are expected to be produced in a mass production environment. The range of warp within the die foot print area 12 is marked with a dashed rectangle 112, which shows that a warp range exceeding 20 μm may be expected within the die foot print area 12.

FIG. 4 shows the result of a simulation for warp of the packaging substrate using a systematic modeling method in which thermomechanical parameters were computed from the variable metal loading, i.e., the percentage of area occupied by metal, in each of the various metal interconnect layers (20', 80') of the packaging substrate.

The warp may be attributed to thermomechanical parameters are asymmetric about the plane of symmetry 51 at the center of the core 50. FIG. 5 demonstrates the warp generating mechanism in which front circuit build-up layers 40', which comprise front metal interconnect layers 20' (See FIG. 1) and front insulator layers 30 (See FIG. 1), has a larger coefficient of thermal expansion (CTE) than back circuit build-up layers 60', which comprise back metal interconnect layers 80' (See FIG. 1) and back insulator layers 70 (See FIG. 1). The front circuit build-up layers 40' contracts more relative to the back circuit build-up layers 60' when the temperature is reduced from the processing temperature for the formation of the various circuit build-up layers (40', 60') to the room temperature.

In view of the above, there exists a need for a packaging substrate having reduced warp than the packaging substrates known in the art.

Particularly, there exists a need for a packaging substrate of which the warp is more immune to temperature changes than the packaging substrates known in the art.

Further, there exists a need for a systematic method for manufacturing a packaging substrate having reduced warp than the packaging substrates known in the art.

SUMMARY OF THE INVENTION

The present invention addresses the needs described above by providing a packaging substrate having matched pattern and/or percentage of metal areas in top metal interconnect layers and bottom metal interconnect layers. The present invention also provides a design method for patterning the front and back metal interconnect layers having symmetric thermomechanical properties, while providing maximum flexibility to the design process.

In the present invention, a pattern matched pair of a front metal interconnect layer and a back metal interconnect layer having matched thermal expansion coefficients are provided for a reduced warp packaging substrate. Metal interconnect layers containing a high density of wiring and complex patterns are first developed so that interconnect structures for signal transmission are optimized for electrical performance. Metal interconnect layers containing a low density wiring and relatively simple patterns are then modified to match the pattern of a mirror image metal interconnect layer located on the opposite side of the core and the same number of metal interconnect layer away from the core. For example, metal interconnect layers containing ground planes and power planes that are typically solid sheets of metal with through via holes therein may be pattern-matched with a corresponding mirror image layer on the other side of the core. During this pattern-matching process, the contiguity of electrical connection in the metal layers with a low density wiring may become disrupted. The disruption is healed by an additional design step in which the contiguity of the electrical connection in the low density wiring is reestablished. A solid plate may be transformed into a fine-pitched structure matching a mirror image layer, or may further be transformed into equivalent structures having a matched percentage of metal area to the mirror image layer.

According to an aspect of the present invention, a package substrate for mounting a semiconductor chip is provided. The packaging substrate comprises:

a core comprising an organic material or lower-CTE material such as silicon or ceramic;

a front metal interconnect layer containing patterned pieces of metal and an insulator material and located on and above a top surface of the core; and a back metal interconnect layer containing patterned pieces of the metal and the insulator material and located on and below a bottom surface of the core, wherein a conformal one-to-one mapping exists between the front metal interconnect layer and the back metal interconnect layer, wherein a positive correlation exists between a pattern of the back metal interconnect layer and a pattern of the front metal interconnect layer, and wherein a probability to detect presence of metal at a corresponding point location in the front metal interconnect layer, obtained by the conformal one-to-one mapping of a randomly selected point location in the back metal interconnect layer at which metal is present, is greater than a ratio of a total area of metal within the front metal interconnect layer to a total area of the front metal interconnect layer.

In one embodiment, a probability to detect absence of metal at a corresponding point location in the front metal interconnect layer obtained by the conformal one-to-one mapping of another randomly selected point location in the back metal interconnect layer at which metal is not present is greater than a ratio of a total area in which metal is not present within the front metal interconnect layer to the total area of the front metal interconnect layer.

In another embodiment, the randomly selected point location within the front metal interconnect layer and the point location in the back metal interconnect layer are coincidental in a superposition of a design of the front metal interconnect layer with a design of the back metal interconnect layer, and wherein the probability is less than 1.

In even another embodiment, the pattern of the back metal interconnect layer contains at least one geometric feature, and the pattern of the front metal interconnect layer contains at least another geometric feature, wherein the at least one geometric feature and the at least another geometric feature are different.

In yet another embodiment, the front metal interconnect layer and the back metal interconnect layer have identical sizes.

In still another embodiment, the front metal interconnect layer and the back metal interconnect layer comprise a metal that is one of copper, gold, silver, and nickel.

In a further embodiment, the ratio of the total area of the metal within the front metal interconnect layer to the total area of the front metal interconnect layer and another ratio of a total area of metal within the back metal interconnect layer to a total area of the back metal interconnect layer are within 30% of each other, and preferably within 15% of each other, and most preferably within 10% of each other.

In another further embodiment, for a randomly selected pattern containing a contiguous piece of the metal located in a region in the back metal interconnect layer, a probability that a first ratio exceeds a second ratio is greater than 50%, wherein the first ratio is a ratio of a total area of the metal within a corresponding region of the top metal interconnect layer to a total area of the corresponding region, and wherein the second ratio is the ratio of the total area of the metal within the front metal interconnect layer to the total area of the front metal interconnect layer.

In an even another embodiment, an entirety of boundaries of the corresponding region and an entirety of boundaries of the region are coincidental in a superposition of a design of the front metal interconnect layer with a design of the back metal interconnect layer.

In a yet another embodiment, for a randomly selected pattern containing a contiguous region in which the metal is absent in the back metal interconnect layer, a probability that a first ratio exceeds a second ratio is greater than 50%, wherein the first ratio is a ratio of a total area in which the metal is absent within a corresponding region of the top metal interconnect layer to a total area of the corresponding region, and wherein the second ratio is a ratio of a total area in which the metal is absent within the front metal interconnect layer to the total area of the front metal interconnect layer.

In a still another embodiment, an entirety of boundaries of the corresponding region and an entirety of boundaries of the region are coincidental in a superposition of a design of the front metal interconnect layer with a design of the back metal interconnect layer.

In a still yet another embodiment, the pattern of the back metal interconnect layer encompasses an entirety of the back metal interconnect layer and the pattern of the front metal interconnect layer encompasses an entirety of the front metal interconnect layer.

According to another aspect of the present invention, another packaging substrate for mounting a semiconductor chip is provided. The packaging substrate comprises:

a core comprising a ceramic material or an organic material;

a front metal interconnect layer containing patterned pieces of metal and an insulator material and located on and above a top surface of the core; and a back metal interconnect layer containing patterned pieces of the metal and the insulator material and located on and below a bottom surface of the core, wherein a conformal one-to-one mapping exists between the front metal interconnect layer and the back metal interconnect layer, wherein for a geometrical shape that may be isotropically and arbitrarily scaled in size by varying a dimension, at least one value exists for the dimension at which fractional metal areas of a pair of randomly selected regions positively correlate to each other, wherein the pair of randomly selected regions comprises a first region located in the front metal interconnect layer and a second region located in the back metal interconnect layer, wherein the first region and the second region are projected into each other by the conformal one-to-one mapping, and wherein the first region and the second region have the geometrical shape and the value for the dimension.

In one embodiment, a correlation coefficient for the positive correlation is less than 1.

In another embodiment, the pattern of the back metal interconnect layer contains at least one geometric feature, and the pattern of the front metal interconnect layer contains at least another geometric feature, wherein the at least one geometric feature and the at least another geometric feature are different.

In even another embodiment, the front metal interconnect layer and the back metal interconnect layer have identical sizes.

In yet another embodiment, an entirety of boundaries of the first region and an entirety of boundaries of the second region are coincidental in a superposition of a design of the front metal interconnect layer with a design of the back metal interconnect layer.

According to even another aspect of the present invention, even another packaging substrate for mounting a semiconductor chip is provided. The packaging substrate comprises:

a set of front circuit build-up layers located in an upper portion of the packaging substrate, wherein each of the front circuit build-up layers comprise a front metal interconnect layer and a front insulator layer; and a set of back circuit build-up layers located in a lower portion of the packaging substrate, wherein each of the back circuit build-up layers comprise a back metal interconnect layer and a back insulator layer, and wherein the set of front build-up layers and the set of back build-up layers have a symmetric three-dimensional distribution of coefficient of thermal expansion.

According to yet another aspect of the present invention, a method of generating a matched pair of a first pattern for a front metal interconnect layer and a second pattern for a back metal interconnect layer for a packaging substrate is provided. The method comprises:

providing a first prototype pattern for the front metal interconnect layer and a second prototype pattern for the back metal interconnect layer;

establishing a conformal one-to-one mapping between the first prototype pattern and the second prototype pattern;

comparing the first prototype pattern and the second prototype pattern for complexity between regions correlated by the conformal one-to-one mapping; and identifying a pattern of higher complexity in one of the regions and superposing the pattern of the higher complexity to the other of the regions to generate a modified pattern.

In one embodiment, the identifying of the pattern of the higher complexity employs comparison of total lengths of boundaries between metal regions and insulator regions within each of the regions correlated by the conformal one-to-one mapping.

In another embodiment, the identifying of the pattern of the higher complexity employs comparison of an average size of shapes of metal pieces, an average size of shapes of insulator regions, a total number of metal pieces, or a total number of insulator regions within each of the regions correlated by the conformal one-to-one mapping.

In even another embodiment, the conformal one-to-one mapping is a superposition of the first prototype pattern with the second prototype pattern.

In yet another embodiment, the method further comprises:

subdividing the first prototype pattern into first regions and the second prototype pattern into second regions, wherein each of the first regions is correlated to one of the second regions by the conformal one-to-one mapping; and comparing a correlated pair of one of the first regions and one of the second regions for the complexity.

In still another embodiment, the method further comprises:

comparing patterns of electrical connections between pairs of locations at which vias for inter-level connection are present in each of the modified pattern and one of the first and prototype patterns out of which the modified pattern is generated; and matching the patterns of electrical connections by introducing additional metal areas to the modified pattern.

In a further embodiment, a solid block of metal or a solid block of insulator within the other of the regions becomes a patterned area having the same pattern as the one of the regions.

In an even further embodiment, a solid block of metal or a solid block of insulator within the other of the regions becomes a patterned area having a scaled pattern of the pattern of the higher complexity, wherein the scaled pattern has substantially the same metal area to insulator area ratio as the pattern of the higher complexity.

According to still another aspect of the present invention, a method of manufacturing a packaging substrate is provided. The method comprises:

forming a core comprising a ceramic material or an organic material;

forming a front metal interconnect layer containing patterned pieces of metal and an insulator material and located on and above a top surface of the core; and forming a back metal interconnect layer containing patterned pieces of the metal and the insulator material and located on and below a bottom surface of the core, wherein a conformal one-to-one mapping exists between an entire surface of the front metal interconnect layer and an entire surface of the back metal interconnect layer, and wherein a positive correlation exists between a pattern of the back metal interconnect layer and a pattern of the front metal interconnect layer so that a probability to detect presence of metal at a randomly selected point location within the front metal interconnect layer that corresponds to a point location in the back metal interconnect layer at which metal is present is greater than a ratio of a total area of metal within the front metal interconnect layer to a total area of the front metal interconnect layer.

In one embodiment, the method further comprises:

forming at least one intervening front metal interconnect layer between the core and the front metal interconnect layer; and forming at least one intervening back metal interconnect layer between the core and the back metal interconnect layer, wherein the number of the intervening front metal interconnect layers and the number of the intervening back metal interconnect layers are the same.

In another embodiment, the at least one intervening front metal interconnect layer, the front metal interconnect layer, the at least one intervening back metal interconnect layer, and the back metal interconnect layer are formed layer by layer.

In even another embodiment, the core comprises an organic material and the insulator material comprises organic or resin material.

BRIEF DESCRIPTION OF THE DRAWINGS

FIGS. 7(a)-7(d) show a first set of exemplary images of front and back metal interconnect layers according to the present invention.

FIGS. 8(a)-8(e) show a second set of exemplary images of front and back metal interconnect layers according to the present invention.

DETAILED DESCRIPTION OF THE INVENTION

As stated above, the present invention relates to packaging substrates having pattern-matched metal layers, methods of manufacturing the same, and methods of generating matched patterns for metal layers for the same, which are now described in detail with accompanying figures.

Figure 1:
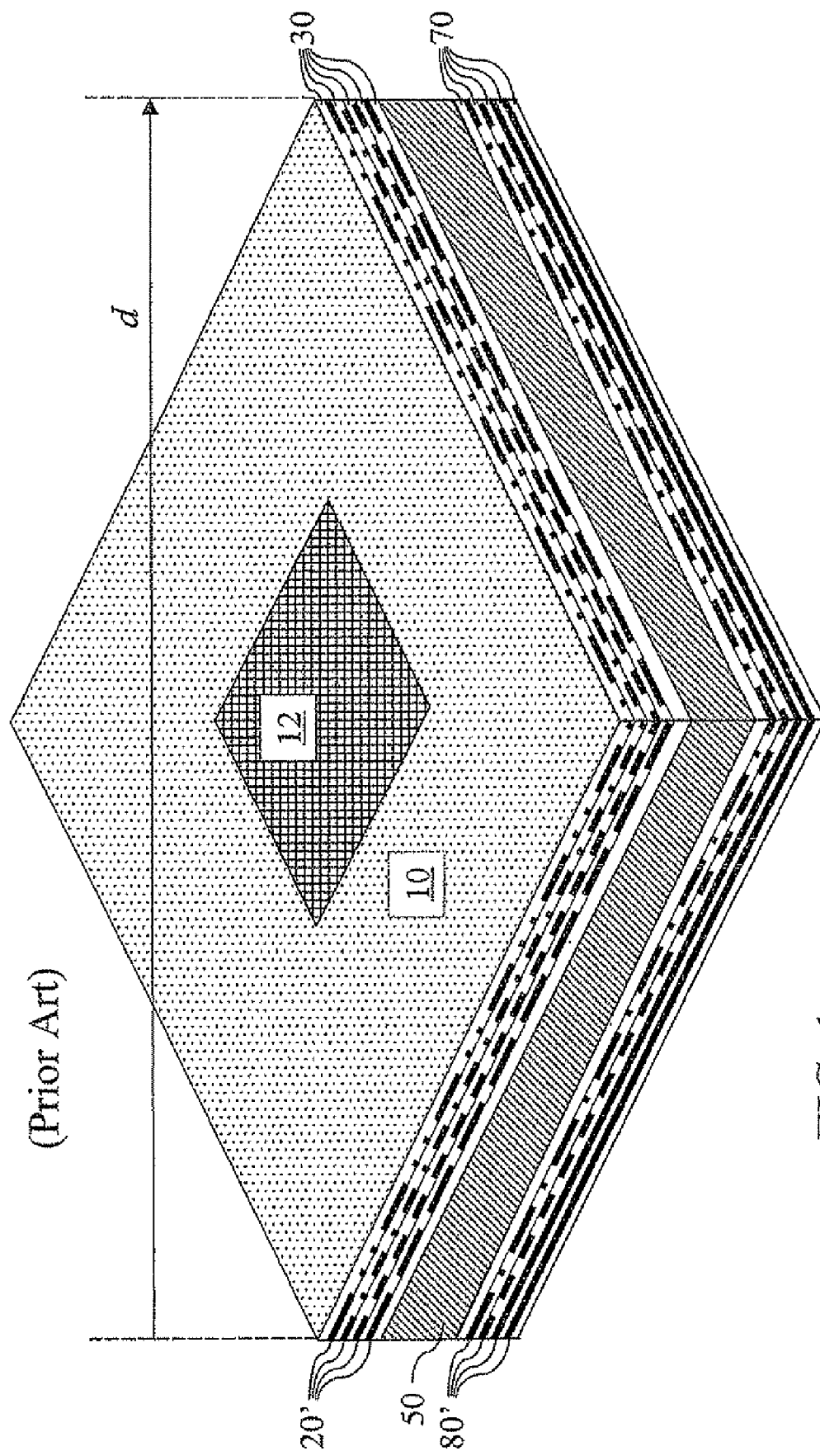
FIG. 1 shows a prior art packaging substrate having a die foot print area 12 for attaching a semiconductor chip.
Figure 2B:
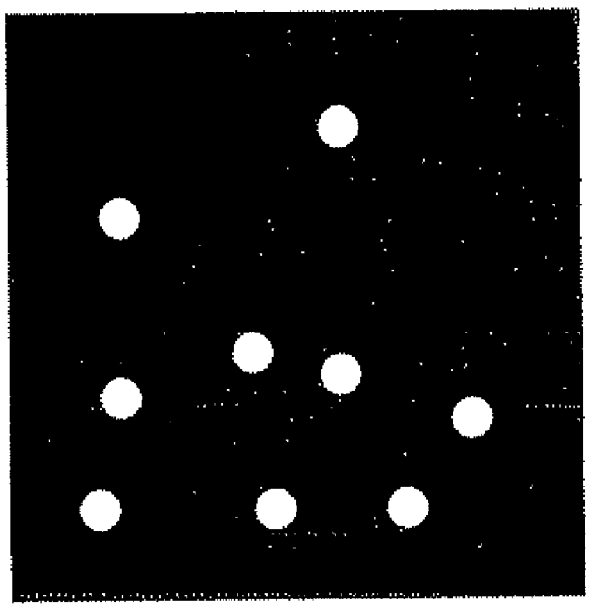
FIGS. 2A and 2B show exemplary patterns of a pair of a top metal interconnect layer 20' and a bottom metal interconnect layer 80' for the prior art packaging substrate of FIG. 1.
Figure 2A:
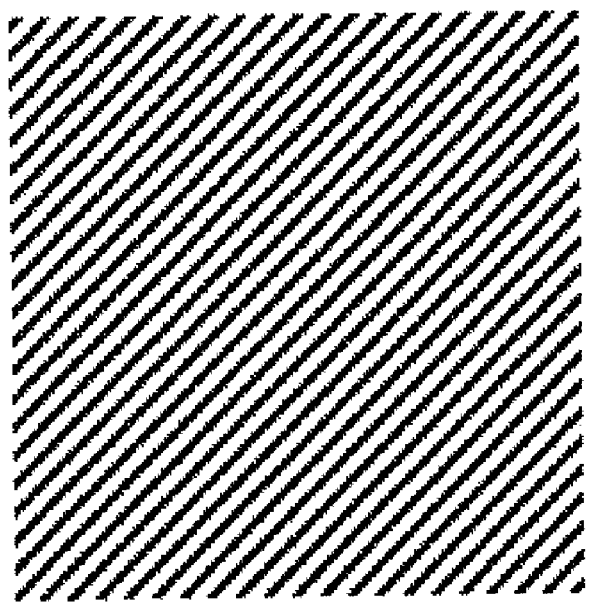
Figure 3:
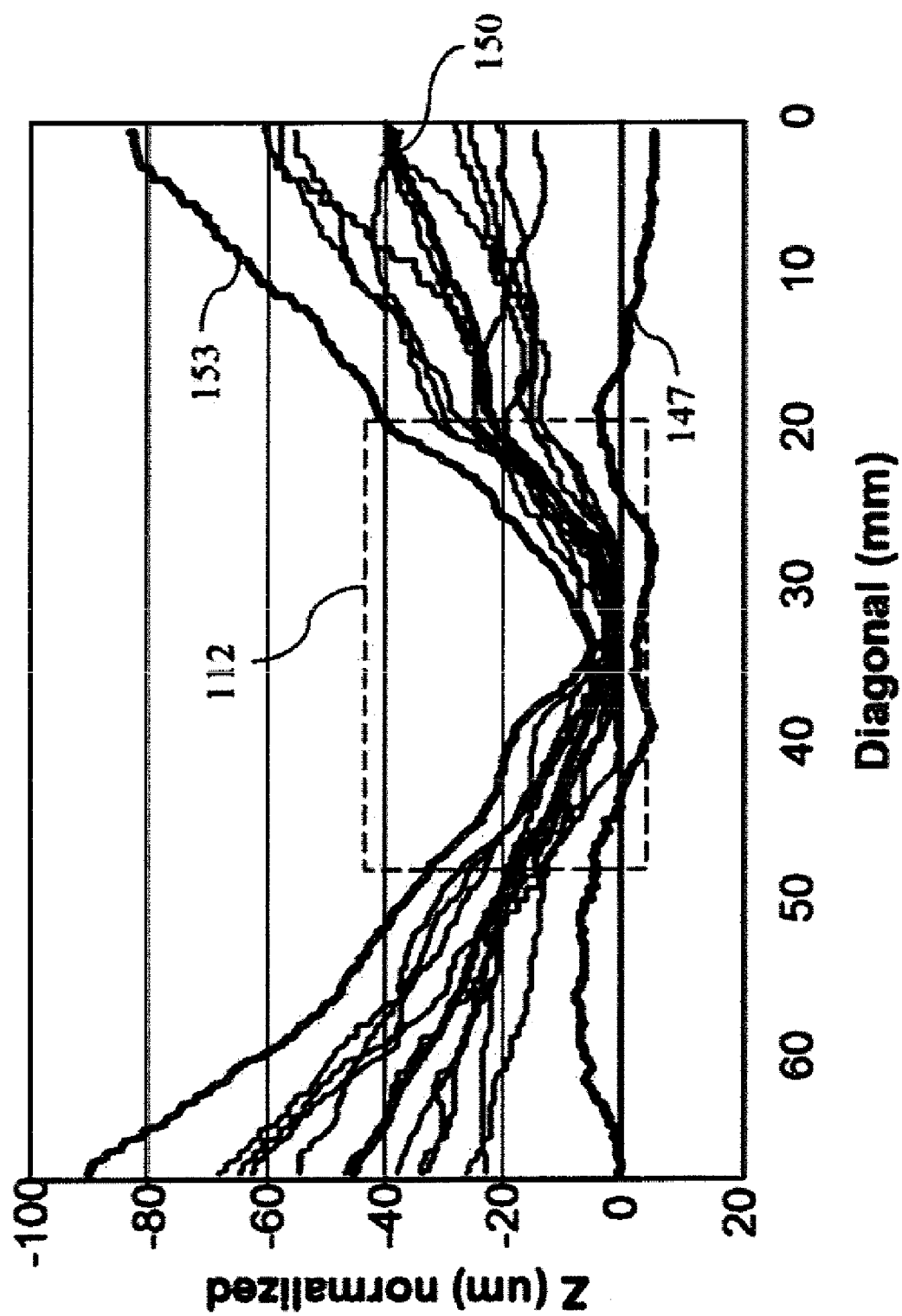
FIG. 3 shows the measured warp of 12 samples of an organic packaging substrate having a 55 mm×55 mm size
Figure 4:
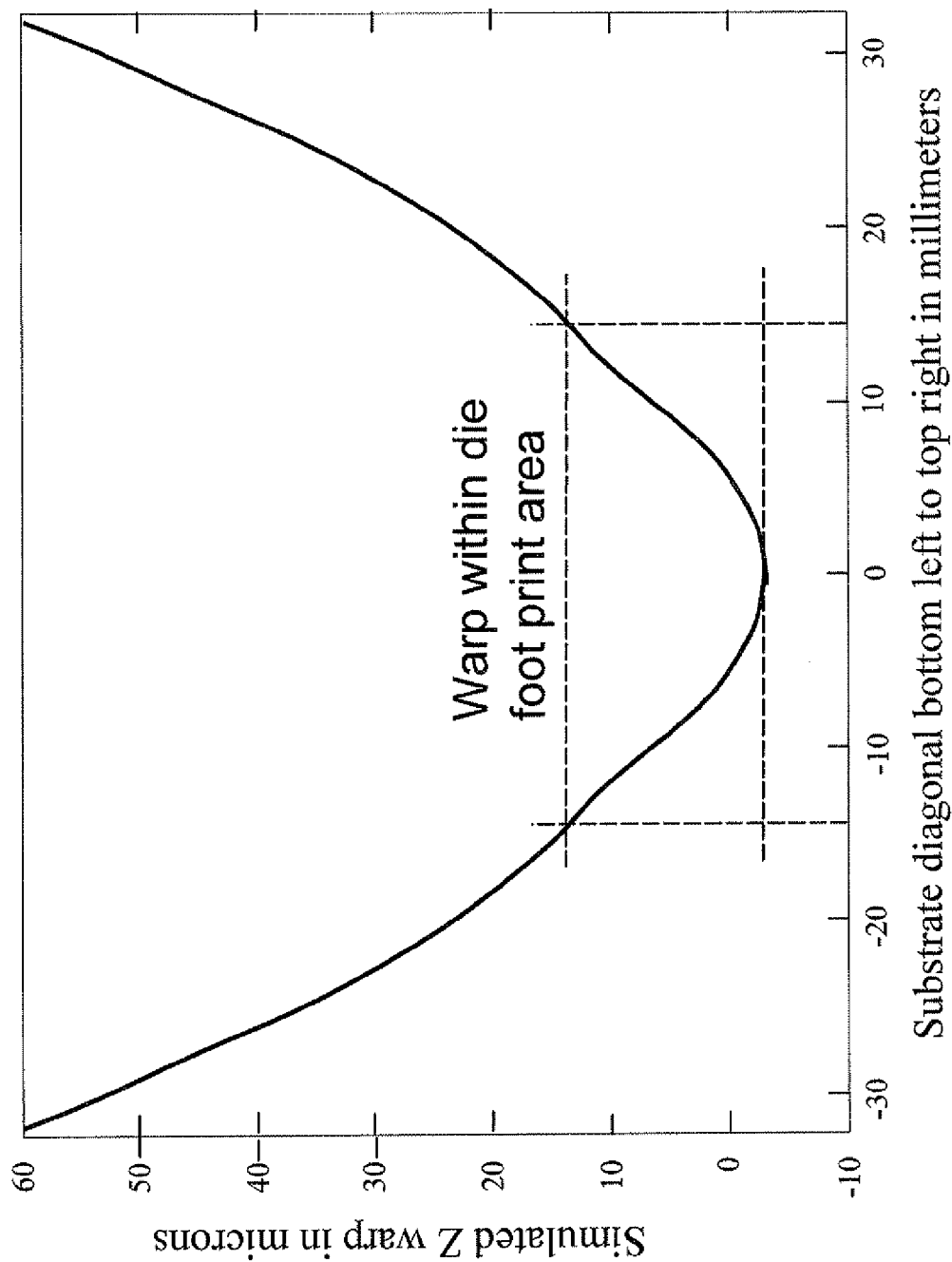
FIG. 4 shows the result of a simulation for warp of the packaging substrate using a systematic modeling method.
Figure 5:
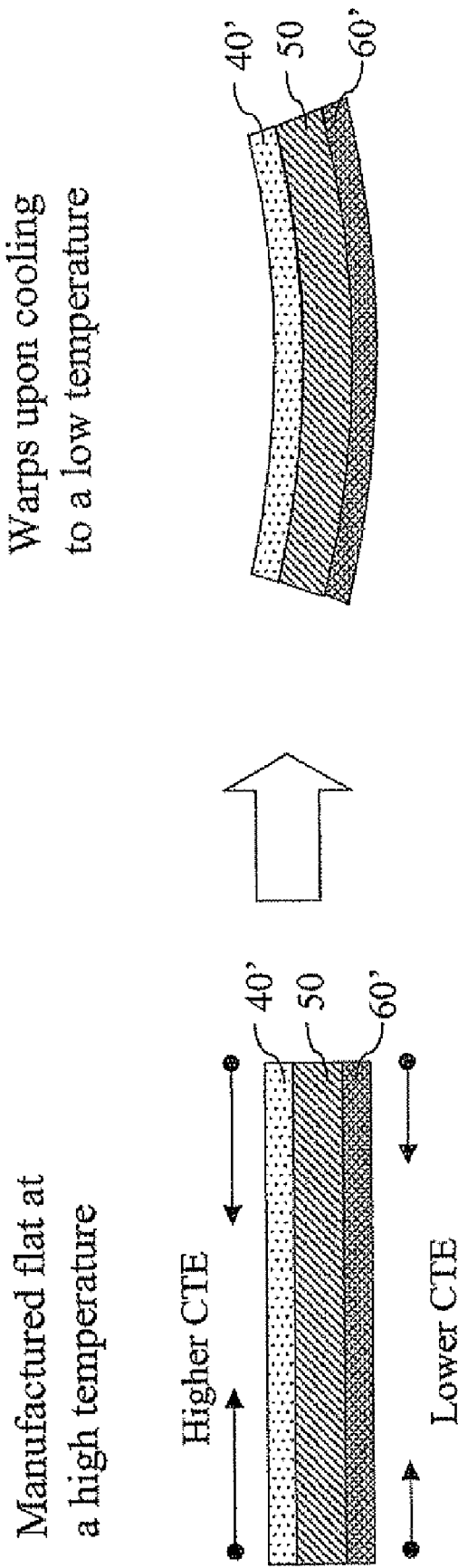
FIG. 5 demonstrates the warp generating mechanism in the prior art packaging substrate having mismatched coefficients of thermal expansion (CTEs) between front circuit build-up layers and back circuit build-up layers.
Figure 6:
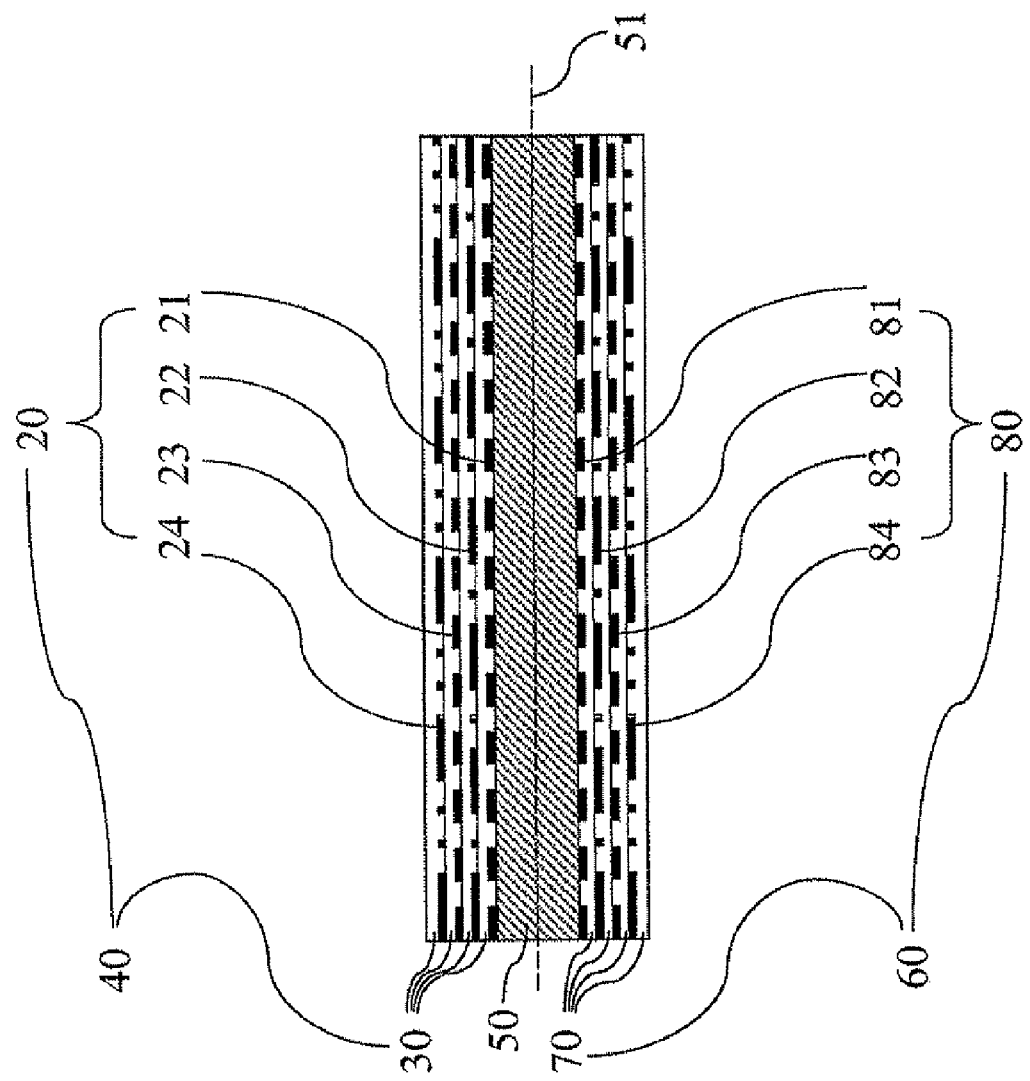
FIG. 6 is a vertical cross-sectional view of an exemplary packaging substrate according to the present invention.

Referring to FIG. 6, an exemplary packaging substrate according to the present invention comprises a core 50 comprising an insulator material such as a ceramic material or an organic material. The organic material may be reinforced with fiberglass. Also, the organic material may comprise a resin material. In case the insulator material of the core 50 comprises a ceramic material, the exemplary packaging substrate is a ceramic packaging substrate. In case the insulator material of the core 50 comprises an organic material, the exemplary packaging substrate is an organic packaging substrate. While the degree of beneficial effects of the present invention may be greater on an organic packaging substrate than on a ceramic substrate since warp of a packaging substrate is typically greater in an organic packaging substrate compared to a ceramic substrate, the inventive elements of the present invention may be applied to both types of packaging substrates.

A horizontal plane of symmetry 51 is located the middle of the core 50, which corresponds to the physical middle plane between the top surface of the core 50 and the bottom surface of the core 50. Front metal interconnect layers 20 are located above the core 50 and back metal interconnect layers 80 are located below the core 50. Each of the front metal interconnect layers 20 and each of the back metal interconnect layers 80 contains patterned pieces of metal and an insulator material. The patterned pieces of metal may comprise copper, gold, silver, nickel, or any other high conductivity material. The set of all patterned pieces of metal within the same level constitutes a front metal interconnect layer 20 or a back metal interconnect layer 70. The thickness of each of the metal interconnect layers 20 and the back metal interconnect layers 70 may be from about 20 μm to about 80 μm, and preferably from about 35 μm to about 65 μm, although lesser and greater thicknesses are explicitly contemplated herein.

Multiple levels of front metal interconnect layers 20 and multiple levels of back metal interconnect layers 70 may be formed. Preferably, the total number of the front metal interconnect layers 20 and the total number of back metal interconnect layers are the same, and may be from about 5 to about 30, respectively, in the case of an organic packaging substrate, and may be from about 20 to about 100, respectively, in the case of a ceramic packaging substrate, although lesser and greater numbers are explicitly contemplated herein.

Four of front metal interconnect layers 20 and four of back metal interconnect layers 70 are shown in the exemplary packaging substrate. The four front metal interconnect layers 20 comprise a first front metal interconnect layer 21, which is closest to the core 50 among the four front metal interconnect layers 20, and a second through fourth front metal interconnect layers (22, 23, 24) which decrease sequentially in proximity from the core 50. Likewise, four back metal interconnect layers 80 comprise a first back metal interconnect layer 81, which is closest to the core 50 among the four back metal interconnect layers 80, and a second through fourth back metal interconnect layers (82, 83, 84) which decrease sequentially in proximity from the core 50. Selection of 4 as the number of front metal interconnect layers 20 and the number of back metal interconnect layers 80 is for the purposes of illustrating the present invention. The number of the front metal interconnect layers 20 and the number of the back metal interconnect layers 80 may be changed arbitrarily in the practice of the present invention.

Each of the front metal interconnect layers 20 is interspersed, i.e., separated amongst one another, by multiple front insulator layers 30 comprising an insulating material and each having a thickness from about 20 nm to about 40 nm. The insulating material may be a ceramic material in the case of a ceramic packaging substrate, or may be an organic material such as a resin material. Each of the back metal interconnect layers 80 is interspersed by multiple back insulator layers 70 comprising the insulating material and each having a thickness from about 20 nm to about 40 nm. Lesser and greater thicknesses for each of the multiple front insulator layers 30 and each of the multiple back insulator layers 70 are explicitly contemplated herein.

The front metal interconnect layers 20 and the front insulator layers 30 collectively constitute front circuit build-up layers 40, and the back metal interconnect layers 80 and the back insulator layers 70 collectively constitute back circuit build-up layers 40. The front circuit build-up layers 40 and the back circuit build-up layers 60 may be formed layer by layer by methods well-known in the art such as pressing at an elevated temperature.

Preferably, each of the front metal interconnect layers 20 may be paired with one of the back metal interconnect layers 80 having the same number of intervening metal interconnect layers. Specifically, the first front metal interconnect layer 21 is paired with the first back metal interconnect layer 81, the second front metal interconnect layer 22 is paired with the second back metal interconnect layer 82, the third front metal interconnect layer 23 is paired with the third back metal interconnect layer 83, and the fourth front metal interconnect layer 24 is paired with the fourth back metal interconnect layer 84. Within each pair of a front metal interconnect layer (21, 22, 23, or 24) and a back metal interconnect layer (81, 82, 83, or 84, respectively), the number of intervening metal interconnect layers are the same.

The pattern of the metal regions and insulator regions within each of the front metal interconnect layer and the back metal interconnect layer within the pair are substantially matched, and as a consequence, the front metal interconnect layer and the back metal interconnect layer have a substantially matched fractional metal area, i.e., the ratio of the total area of metal within the front metal interconnect layer to the total area of the front metal interconnect layer is substantially matched to the ratio of the total area of metal within the back metal interconnect layer to the total area of the back metal interconnect layer. The two ratios may be matched within 30%, and preferably within 15%, and most preferably within 10%.

The substantial matching of the pattern of metal regions and insulator regions within each pair of the front metal interconnect layer and the back metal interconnect layer having the same number of intervening layers is schematically represented by the similarity of cross-sectional areas of the top and bottom metal interconnect layers within each pair in FIG. 6.

While it is preferable to match the number of front metal interconnect layers 20 and the number of the back metal interconnect layers 80, the present invention may be practiced with unequal numbers of front metal interconnect layers 20 and the number of the back metal interconnect layers 80, in which some metal interconnect layers are not paired.

The pattern in each of the top metal interconnect layers 20 and the bottom metal interconnect layers 8 may be substantially a mirror image of a corresponding opposite layer, which is the other metal interconnect layer within each pair of the front metal interconnect layer and the back metal interconnect layer having the same number of intervening metal interconnect layers. As a result of a substantial mirror symmetry in the patterns of the top and bottom metal interconnect layers (20, 80), thermomechanical parameters including coefficient of thermal expansion have a symmetric distribution about the plane of symmetry 51 located at the centre of the core 50. The symmetry in the thermomechanical parameters minimizes warp of the packaging substrate during thermal cycling of the inventive packaging substrate.

Further, process variations that symmetrically affect the front circuit build-up layers 40 and back circuit build-up layers, such as thicknesses of metal plating for each pair of a front metal interconnect layer and a back metal interconnect layer having the same number of intervening layers and formed by the same plating process, induce symmetric parameter variations from a nominal value. Thus the inventive packaging substrate containing pattern-matched pairs of metal interconnect layers across the front circuit build-up layers 40 and the back circuit build-up layers 60 minimizes warp since effects of process variations are counterbalanced for process variation that occur symmetrically between the pattern matched pairs of metal interconnect layers.

Preferably, the patterns between the front metal interconnect layer and the back interconnect layer with each pair are matched by a simple superposition of the two patterns when viewed from the same direction, i.e., from above the packaging substrate. In case the pattern of the front metal interconnect layer is viewed from above and the pattern of the back metal interconnect layer is view from below, the two patterns may be considered mirror images of each other. It is recognized, however, that the matching of the two patterns in the above manner is not necessary to practice the present invention. Since the fractional metal areas are matched across the front metal interconnect layer and the back metal interconnect layer, a rotation of one of the matched patterns, flipping or a mirror image generation of one of the matched patterns, or even shuffling and rearranging one of the matched patterns still preserves the fraction of the metal area relative to the total area of the pattern, and thus benefits from a globally matched coefficients of thermal expansion between the front metal interconnect layer and the back metal interconnect layer. These manipulations are area-preserving mappings of an image into another image. Some of these manipulations are conformal mapping in which all angles between intersecting curves remain unchanged and at any point, the scale remains the same. Mathematically, the determinant of the Jacobian matrix of a linear transformation has a magnitude of 1 at any point of the mapped area. Such variations are explicitly contemplated herein.

FIG. 7(a)-7(d) show a first set of exemplary images of front and back metal interconnect layers according to the present invention. Black areas represent areas in which metal is present in the design, and white areas represent areas in which an insulator material is present in the design, i.e., the metal is not present. A pair of a front metal interconnect layer and a back metal interconnect layer separated from the core 50 (See FIG. 6) by the same number of intervening metal interconnect layers are provided. One of the two metal interconnect layers may contain a high density of wiring and complex patterns, while the other may contain a low density wiring and relatively simple patterns. For example, the front metal interconnect layer may contain the complex patterns, and the back metal interconnect layer may contain the simple patterns. The patterns in the pair of metal interconnect layers are provided as known in the art, and herein referred to as prototype patterns to be distinguished from modified patterns generated according to the present invention. The prototype patterns are generated so that interconnect structures for signal transmission are optimized for electrical performance and suitable power grid network and ground network are provided.

FIG. 7(a) is a first prototype pattern for a front metal interconnect layer containing a relatively complex pattern of interconnect wiring, and FIG. 7(b) is a first prototype pattern for a back metal interconnect layer containing a solid sheet of metal with holes therein that may be employed for a power grid network or a ground network. The holes in the back metal interconnect layer of FIG. 7(b) may be employed to pass through vias that connect to another metal interconnect layer located at another level. The pattern of the bottom metal interconnect layer in FIG. 7(b) may be considered a simpler pattern than the pattern of the front metal interconnect layer in FIG. 7(a) in terms of the total length of boundary between metal pieces (marked by black areas) and a dielectric material (marked by white areas).

Referring to FIGS. 7(c) and 7(d), the prototype patterns are modified by superposing elements of a more complex pattern in one of the two metal interconnect layers, which is the front metal interconnect layer shown in FIG. 7(a), into the simpler pattern of the other of the two metal interconnect layers, which is the back metal interconnect layer shown in FIG. 7(b). The superposition of the element of the pattern in FIG. 7(a) onto the pattern in FIG. 7(b) results in FIG. 7(d), which is a modified pattern for the bottom metal interconnect layer according to the present invention. In this case, no modification is performed on the pattern of the front metal interconnect layer shown in FIG. 7(a). Consequently, FIG. 7(c), which is the pattern for the front metal interconnect layer after the pattern modification process, is the same as the pattern in FIG. 7(a), i.e., the pattern for the top metal interconnect layer is not changed.

The pair of the pattern for the top metal interconnect layer in FIG. 7(c) and the pattern for the bottom metal interconnect layer in FIG. 7(d) are nearly symmetric. The remaining asymmetry between the pattern for the top metal interconnect layer and the pattern for the bottom metal interconnect layer after the pattern modifications reflects functional asymmetry between the top metal interconnect layer and the bottom interconnect layer.

Modifications to the original prototype pattern of the bottom metal interconnect layer during the process of pattern superposition and generation of the modified pattern are apparent in FIG. 7(d). Since the front metal interconnect layer has many independent conductive metal lines where the back metal interconnect layer has a contiguous plane with holes, the modification of the pattern for the back metal interconnect layer needs to provide equivalent electrical functionality of the prototypical pattern of the back metal interconnect layer without drastically deviating the newly superposed prototype pattern of the front metal interconnect layer. Thus, the holes are preserved in the modified pattern for the back metal interconnect layer in FIG. 7(d).

Replicated image metal regions 91 that are formed in the modified pattern by replicating the prototype pattern of the top metal interconnect layer in FIG. 7(a) may be linked by crosslink metal regions 92 that cross the disconnected metal regions 91. Depending on the current load on the combined set of the replicated image metal regions 91 and the crosslink metal regions 92, the electrical linking of the replicated image metal regions 91 by the crosslink metal regions 92 may be performed in a distributed manner using several cross-linking connectors without stiffening the new pattern, i.e., without causing excessive deviation from the prototype pattern of the top metal interconnect layer of FIG. 7(a). A solid block of metal in the back metal interconnect layer may thus become a patterned area having the same pattern as the front metal interconnect layer.

As the contiguous metal area of the prototype pattern in the bottom metal interconnect layer is replaced with the set of the replicated image metal regions 91 and the crosslink metal regions 92, the presence of the holes for through vias disrupts the continuity of the patterns of the replicated image metal regions 91 and the crosslink metal regions 92, i.e., the presence of the holes supersedes the presence of any other pattern in the modified pattern. Under such condition, the rim of the holes may be made into a circular ring of metal to provide electrical integrity of the modified pattern so that the modified pattern provides equivalent electrical connections to vias for inter-level connection. The electrical equivalence of the modified pattern to the prototypical pattern before modification may be checked by comparing patterns of electrical connections between pairs of locations at which vias for inter-level connection are present across the modified pattern and the prototypical pattern, i.e., the pattern in FIG. 7(b) and the pattern in FIG. 7(d). Additional modifications may be added to the modified pattern in FIG. 7(d) as needed to establish electrical equivalency for all vias for inter-level connection across the pattern in FIG. 7(b) and the pattern in FIG. 7(d).

In general, a conformal one-to-one mapping exists between the front metal interconnect layer and the back metal interconnect layer that are pattern matched employing then methods of the present invention. In a conformal mapping, angles and area are the same between two corresponding regions, which are the entire surface of the front metal interconnect layer and the entire surface of the back metal interconnect layer. Exemplary conformal mappings include, but are not limited to, superposition of one image onto another and combination of superposition and rotation or mirror image generation, i.e., "flipping." The conformal one-to-one mapping may exist between the entirety of the front metal interconnect layer and the entirely of the back metal interconnect layer. Alternately, multiple conformal one-to-one mappings may be provided after subdividing the front metal interconnect layer and the back metal interconnect layer. For example, each of the metal interconnect layers may be subdivided into a left half and a right half. The same type of conformal mappings, or different types of conformal mappings, may be employed. For example, the left halves may be conformally mapped by superposition and the right halves may be mapped by a mirror image generation. Preferably, the entirety of the front metal interconnect layer is mapped onto the entirety of the back metal interconnect layer by the conformal one-to-one mapping. More preferably, the conformal mapping is a superposition of the front metal interconnect layer onto the back metal interconnect layer. In other words, regions of the front metal interconnect layer are matched to regions of the back metal interconnect layer as if one would pick up the front metal interconnect layer and place it on top of the back metal interconnect layer to generate physically coinciding regions, which are the corresponding regions of the conformal one-to-one mapping.

Further, a positive correlation exists between a pattern of the back metal interconnect layer, such as the modified pattern in FIG. 7(d), and a pattern of the front metal interconnect layer, such as the pattern in FIG. 7(c). Due to the positive correlation between the two patterns, the probability to detect presence of metal at a randomly selected point location within the front metal interconnect layer that corresponds to a point location in the back metal interconnect layer at which metal is present is greater than the probability that may be expected based on the fractional metal area of the front metal interconnect layer shown in FIG. 7(c), which is the ratio of the total area of metal within the front metal interconnect layer to the total area of the front metal interconnect layer. Likewise, the probability to detect absence of metal, or presence of an insulator region, at a randomly selected point location within the front metal interconnect layer that corresponds to a point location in the back metal interconnect layer at which metal is not present is greater than the probability that may be expected based on the fractional area of the total of insulator material regions of the front metal interconnect layer shown in FIG. 7(c), which is a ratio of a total area of insulator material regions within the front metal interconnect layer to a total area of the front metal interconnect layer, i.e., the ratio of the total area in which metal is not present within the front metal interconnect layer to the total area of the front metal interconnect layer.

In other words, for an arbitrarily picked point location from the modified pattern in FIG. 7(d), there is an above average probability that the corresponding point location in the pattern in FIG. 7(c) would have metal if the arbitrarily picked point location contains metal, and there is an above average probability that the corresponding point location in the pattern in FIG. 7(c) would have an insulator material, i.e., lacks metal, if the arbitrarily picked point location contains the insulator material. This positive correlation is a result of "copying" patterns across the two metal interconnect layers by superposing elements of patterns from one of the two metal interconnect layers onto the other. The average probabilities are the fractional areas of the total metal area or the total insulator area, which would be the expected values of the probabilities if no correlation between the patterns are present or no details of the pattern in question were known.

Preferably, the conformal mapping is a simple superposition without any rotation of flipping of images. In other words, the pattern in the front metal interconnect layer and the pattern in the back metal interconnect layer after generation of at least one modified pattern produces positive correlation upon simple superposition of the two patterns without rotation or flipping. Thus, the randomly selected point location within the front metal interconnect layer and the point location in the back metal interconnect layer are coincidental in a superposition of a design of the front metal interconnect layer with a design of the back metal interconnect layer.

In most cases, however, the pattern of the back metal interconnect layer contains at least one geometric feature, and the pattern of the front metal interconnect layer contains at least another geometric feature, wherein the at least one geometric feature and the at least another geometric feature are different. Thus, the two patterns after the pattern modification are not the same and the correlation of the two patterns is not perfect. The probability to detect presence of metal or the probability to detect absence of metal is less than 1 if the two patterns after modification are not identical.

It is preferable that the front metal interconnect layer and the back metal interconnect layer have identical sizes so that the conformal mapping is between the entirety of the front metal interconnect layer and the entirety of the back metal interconnect layer having the same number of intervening layers. It is possible, however, to practice the present invention with a front metal interconnect layer and a back metal interconnect layer having different numbers of the intervening metal interconnect layers. Further, it is also possible to practice the present invention on portions of a front metal interconnect layer and portions of a back metal interconnect layer that are less than the entirety of the front or back metal interconnect layer. Further, the present invention may be practiced on a front metal interconnect layer and a back metal interconnect layer having a different size so that a limited areas of the front and back metal interconnect layers may be matched, or only the overall fractional metal area may be matched.

As a natural consequence of pattern matching, the fractional metal areas are matched between the front and back metal interconnect layers. The fractional metal area of the front metal interconnect layer is the ratio of the total area of the metal within the front metal interconnect layer to the total area of the front metal interconnect layer. The fractional metal area of the back metal interconnect layer is the ratio of the total area of the metal within the back metal interconnect layer to the total area of the back metal interconnect layer. The fractional metal area of the front metal interconnect layer and the fractional metal area of the back metal interconnect layer are within 30% of each other, and preferably within 15% of each other, and most preferably within 10% of each other. In some cases, the two fractional metal areas may be matched within 3% of each other.

Statistical analysis of specific types of patterns across the front metal interconnect layer and the back metal interconnect layer also show the positive correlation of the patterns after modification according to the present invention. For a randomly selected pattern containing a contiguous piece of the metal located in a region in the back metal interconnect layer, a corresponding area in the front metal interconnect layer is expected to have higher probability of having metal than the probability of finding metal in a randomly selected point location in the front metal interconnect layer. In other words, knowing that the selected location within the back metal interconnect layer has metal and that a positive correlation exists between the patterns of the front and back metal layers, one can expect that the probability of finding metal in the corresponding point location in the front metal interconnect layer is higher than the fractional metal area of the front metal interconnect layer.

The above situation may be expressed by a probability statement involving ratios. A first ratio herein denotes the ratio of the total area of the metal within a corresponding region of the top metal interconnect layer to the total area of the corresponding region. A second ratio herein denotes the ratio of the total area of the metal within the front metal interconnect layer to the total area of the front metal interconnect layer. The probability that the first ratio exceeds the second ratio is greater than 50% due to the positive correlation of the two patterns after modification of at least one pattern.

In case the conformal one-to-one mapping of the two patterns is a simple superposition, the entirety of boundaries of the corresponding region and the entirety of boundaries of the region are coincidental in a superposition of a design of the front metal interconnect layer with a design of the back metal interconnect layer.

In the same manner, for a randomly selected pattern containing a contiguous region in which the metal is absent in the back metal interconnect layer, a corresponding area in the front metal interconnect layer is expected to have higher probability of having an insulator material, i.e., not having the metal, than the probability of finding the insulator material in a randomly selected point location in the front metal interconnect layer, which is the fractional area of the insulator material within the front metal interconnect layer.

A third ratio herein denotes the ratio of the total area of the insulator material within a corresponding region of the top metal interconnect layer to the total area of the corresponding region. A fourth ratio herein denotes the ratio of the total area of the insulator material within the front metal interconnect layer to the total area of the front metal interconnect layer, which is equal to 1 minus the second ratio. The probability that the third ratio exceeds the fourth ratio is greater than 50% due to the positive correlation of the two patterns after modification of at least one pattern.

In case the conformal one-to-one mapping of the two patterns is a simple superposition, the entirety of boundaries of the corresponding region and the entirety of boundaries of the region are coincidental in a superposition of a design of the front metal interconnect layer with a design of the back metal interconnect layer.

Typically, the pattern of the back metal interconnect layer encompasses the entirety of the back metal interconnect layer and the pattern of the front metal interconnect layer encompasses the entirety of the front metal interconnect layer.

Figure 8E:
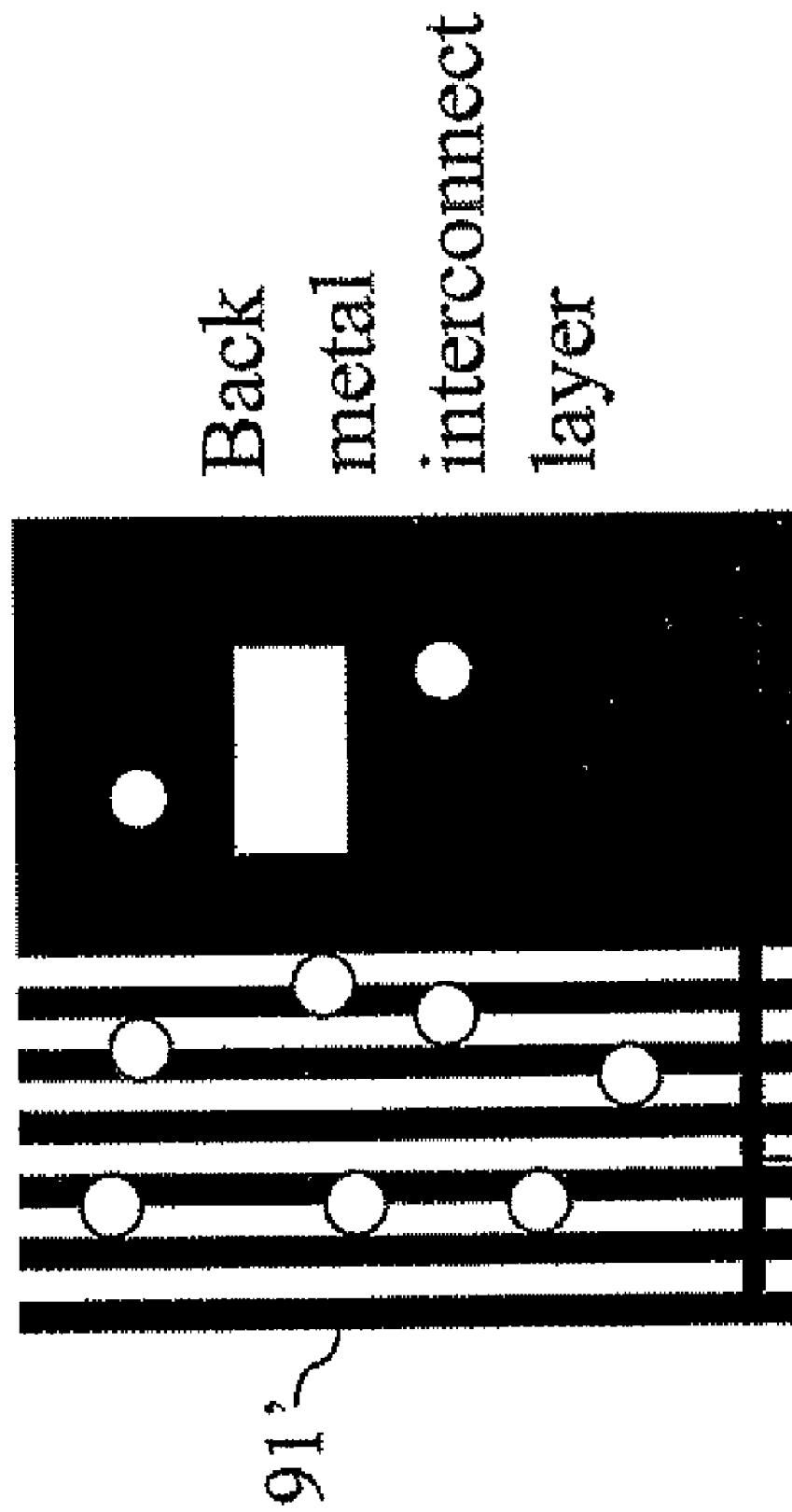

FIG. 8(a)-8(e) show a second set of exemplary images of front and back metal interconnect layers according to the present invention. Black areas represent areas in which metal is present in the design, and while areas represent areas in which an insulator material is present in the design. FIG. 8(a) is a second prototype pattern for a front metal interconnect layer. FIG. 8(b) is a second prototype pattern for a back metal interconnect layer. FIG. 8(c) is a modified pattern for the front metal interconnect layer, and FIG. 8(d) is a modified pattern for the back metal interconnect layer. FIG. 8(e) is a pattern obtained by further modification of the pattern in FIG. 8(d). The conformal one-to-one mapping between the patterns in FIGS. 8(a) and 8(b) is a simple superposition of the two patterns. Also, the conformal one-to-one mapping between the patterns in FIGS. 8(c) and 8(d) is a simple superposition of the two patterns, and so is the conformal one-to-one mapping between the patterns in FIGS. 8(c) and 8(e).

Overall, the second prototype pattern of the back metal interconnect layer in FIG. 8(b) is simpler than the pattern of the second prototype pattern of the front metal interconnect layer in FIG. 8(a). Thus, the overall pattern of the top metal interconnect layer is superposed onto the second prototype pattern in FIG. 8(b) to generate the modified pattern in FIG. 8(d) having similar features as FIG. 7(d) described above. However, examination of the second prototype pattern of the front metal interconnect layer in FIG. 8(a) shows that a relative large area of the second prototype pattern for the front metal interconnect layer comprises a contiguous area of metal. Elements of the second prototype pattern of the back metal interconnect layer in FIG. 8(b) are superposed into the second prototype pattern of the front metal interconnect layer in FIG. 8(a) to form the modified pattern of the front metal interconnect layer in FIG. 8(c). Thus, the superposition of a complex pattern from one of the pair of a front metal interconnect layer and a back metal interconnect layer onto the other containing a simpler pattern may be bidirectional, and may be performed region by region.

The first prototype pattern and the second prototype pattern are compared for complexity between regions correlated by the conformal one-to-one mapping. Different criteria may be employed in determining the relative level of complexity of patterns as provided in the second prototype patterns for the front and back metal interconnect layers.

In one method, the entirety of the prototype pattern of the front metal interconnect layer may be compared with the entirety of the prototype pattern of the back metal interconnect layer. In another method, the prototype pattern of the front metal interconnect layer may be subdivided into first regions and the prototype pattern of the back metal interconnect layer may be subdivided into second regions. The same method of subdivision is employed in formation of the first regions and the second regions so each of the first regions is correlated to one of the second prototype pattern by the conformal one-to-one mapping, e.g., by superposition of the selected first region onto the selected second region. The correlated pair of the selected first region and the selected second region is compared for the level of complexity.

Further, identification of the pattern of the higher complexity may employ one or more of many methods available for pattern comparison. The identification method may employ comparison of total lengths of boundaries between metal regions and insulator regions within each of the regions correlated by the conformal one-to-one mapping.

Alternately or in parallel, the identification of the pattern of the higher complexity may employ comparison of an average size of shapes of metal pieces, an average size of shapes of insulator regions, a total number of metal pieces, or a total number of insulator regions within each of the regions correlated by the conformal one-to-one mapping.

Once the pattern of relatively higher complexity is identified within the pair of correlated regions, which may be the entirety of the front and back metal interconnect layers or correlated subsets thereof, the pattern of higher complexity in one of the regions is superposed onto the other region of the correlated pair to generate a modified pattern.

FIGS. 8(c) and 8(d) show an example of the subdivision of prototype patterns into multiple regions for identification of relatively complex patterns. In the left half LH and the second quarter from the top of the right half RH2Q, the second prototype pattern of the front metal interconnect layer in FIG. 8(a) is more complex than the second prototype pattern of the back metal interconnect layer in FIG. 8(b). Consequently, the second prototype pattern of the front metal interconnect layer in FIG. 8(a) is superposed to the modified pattern of the back metal interconnect layer as shown in FIG. 8(d). In addition, in the upper one quarter of the right half RH1Q and the lower half of the right half RHLH, the second prototype pattern of the back metal interconnect layer is more complex than the second prototype pattern of the front metal interconnect layer. Consequently, the second prototype pattern of the back metal interconnect layer in FIG. 8(b) is superposed to the modified pattern of the front metal interconnect layer as shown in FIG. 8(c). Thus, elements of prototype patterns in a pair of front and back metal interconnect layers may be superposed onto the opposite layer from the front metal interconnect layer to the back metal interconnect layer and vice versa.

Referring to FIG. 8(e), a superposed pattern within the modified pattern may be scaled. Examining the left half of the bottom metal interconnect layer in FIGS. 8(b) and 8(d), a solid block of metal within the second prototype pattern of the bottom metal interconnect layer in FIG. 8(b) is modified into a patterned area in FIG. 8(d). The patterned area in FIG. 8(d) may further be modified into a scaled pattern shown in FIG. 8(e). The scaled pattern may be stretched or compressed in one or two directions. The scaled pattern has substantially the same metal area to insulator area ratio as the pattern prior to scaling, i.e., the scaling preserves the fractional metal area.

Figure 9A:
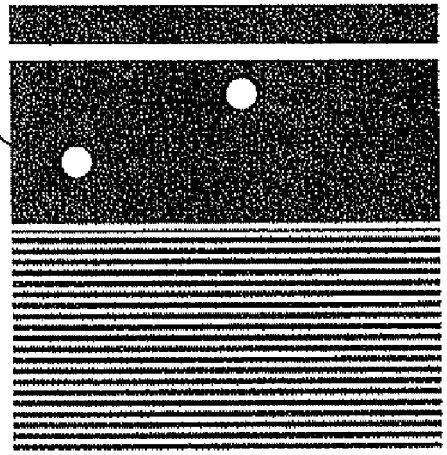
FIGS. 9(a)-9(d) show a third set of exemplary images of front and back metal interconnect layers according to the present invention.
Figure 9C:
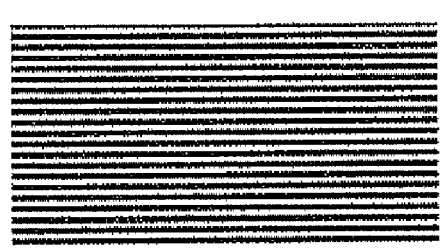
Figure 9B:
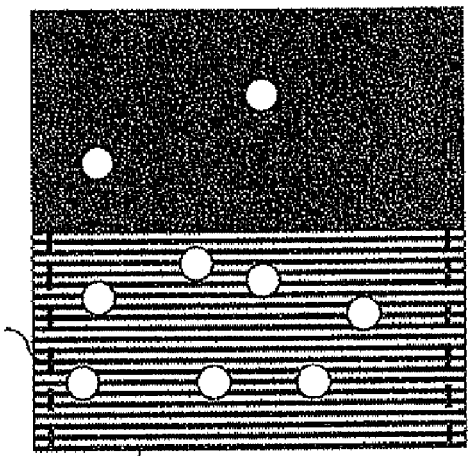
Figure 9D:
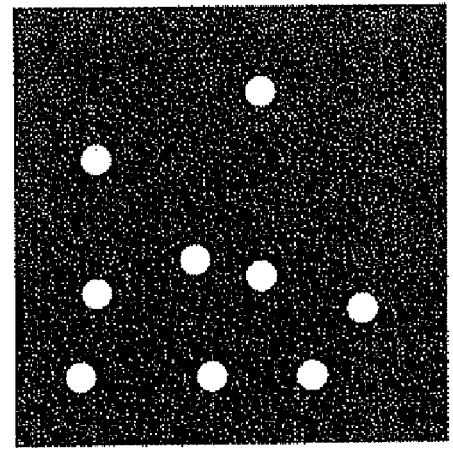

Such a superposition of pattern may be done on a solid block of insulator as well. FIG. 9(a)-9(d) show a third set of exemplary images of front and back metal interconnect layers according to the present invention. Black areas represent areas in which metal is present in the design, and while areas represent areas in which an insulator material is present in the design as in the prior images. FIG. 9(a) is a third prototype pattern for a front metal interconnect layer. FIG. 9(b) is a third prototype pattern for a back metal interconnect layer. FIG. 9(c) is a modified pattern for the front metal interconnect layer, and FIG. 9(d) is a modified pattern for the back metal interconnect layer.

The third prototype pattern of the front metal interconnect layer in FIG. 9(a) contains a solid block of the insulator. The portion of the third prototype pattern within the corresponding region of the bottom metal interconnect layer is superposed on the third prototype pattern of the front metal interconnect layer in FIG. 9(a) to generate the modified pattern for the front metal interconnect layer in FIG. 9(c). The third prototype pattern of the back metal interconnect layer in FIG. 9(b) is modified as well by the pattern of the third prototype pattern of the front metal interconnect layer in FIG. 9(a) to generate the modified pattern of the back metal interconnect layer in FIG. 9(d).

Figure 10A:
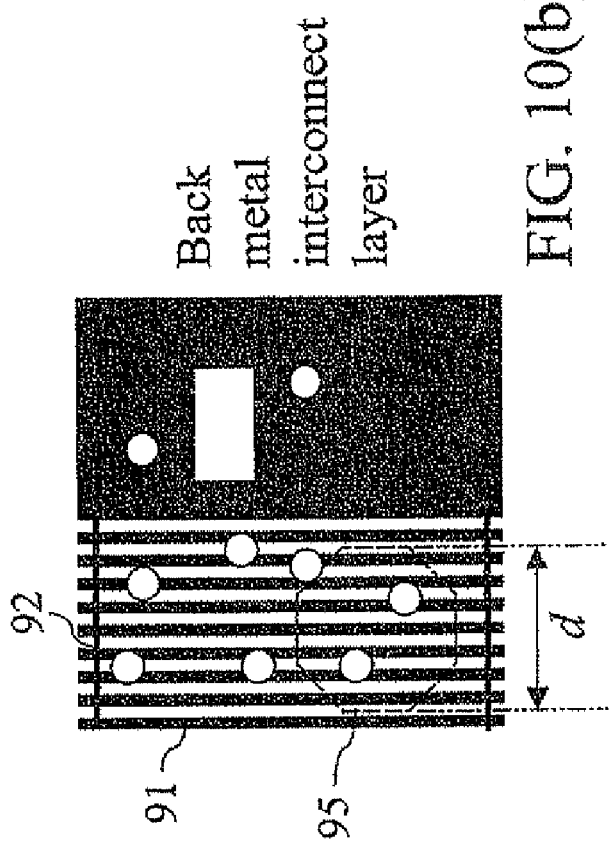
FIG. 10(a) and FIG. 10(b) show a fourth set of exemplary images of back metal interconnect layers.
Figure 10B:
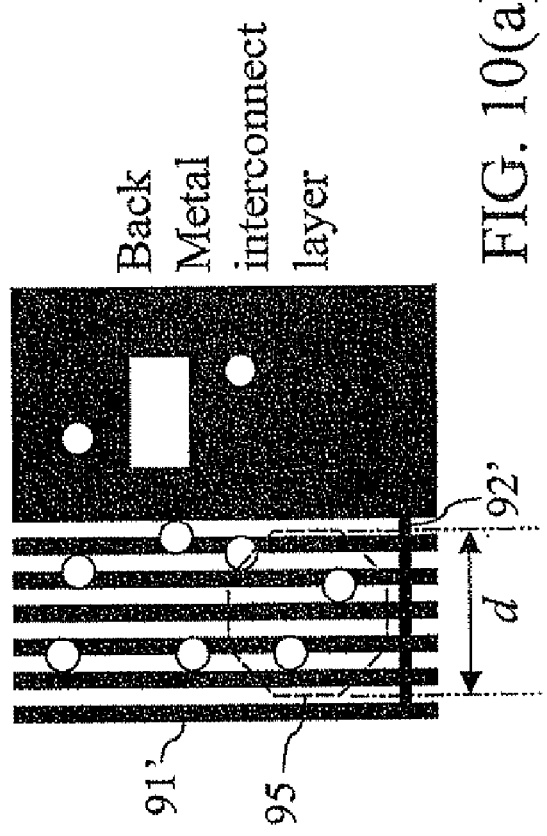

Referring to FIGS. 10(a) and 10(b), two modified patterns for a bottom metal interconnect layer are provided. Comparison of a first modified pattern in FIG. 10(a) and a second modified pattern in FIG. 10(b) is employed to elaborate on scaling of complex patterns that are superposed onto one of the modified patterns as in FIG. 8(e). The scaling of the complex patterns may be along one direction or along two orthogonal directions. Since the fractional metal area of the scaled pattern remains substantially constant except for small variations due to the variations of the pattern at the pattern boundary, probability of locating the metal or the probability of locating an insulator material remains substantially constant. In other words, once the fractional metal area of the complex pattern is known, it is not necessary to know the fractional metal area of the entirety of the modified pattern since the probability of locating the metal or the insulator material within a scaled pattern depends on the fractional metal area within the complex pattern.

To illustrate this point, an geometrical shape 95, which may be a polygon or a curvilinear two dimensional shape, that may be isotropically and arbitrarily scaled in size by varying a dimension, which may be one of a diameter, a diagonal dimension, etc., are provided within corresponding regions of the first modified pattern in FIG. 10(a) and the second modified pattern in FIG. 10(b). As the value of the dimension of the geometrical shape 95 changes, there exists at least one value, and typically a range of values, for the dimension at which a positive correlation between the fractional metal areas of a pair of the randomly selected regions that have the geometrical shape and the value for the dimension within the front and back metal interconnect layers provided that each of the pair of the randomly selected regions are mapped into each other by the conformal one-to-one mapping described above. In other words, the pair of randomly selected regions comprises a first region located in the front metal interconnect layer and a second region located in the back metal interconnect layer, and the first region and the second region are projected into each other by the conformal one-to-one mapping, and the first region and the second region have the geometrical shape and the value for the dimension. In case the conformal one-to-one mapping is a simple superposition of modified patterns of the front and back metal interconnect layers, the positive correlation between the fractional metal areas of the pair of the randomly selected regions that have the geometrical shape and the value for the dimension within the front and back metal interconnect layers provided that the randomly selected regions are located in the same area within each of the modified pattern for the front and back metal interconnect layers. In this case, the entirety of boundaries of the first region and an entirety of boundaries of the second region are coincidental in a superposition of the design of the front metal interconnect layer with the design of the back metal interconnect layer.

Typically, the modified patterns of the front and back metal interconnect layers are not identical. In this case, the pattern of the back metal interconnect layer contains at least one geometric feature, and the pattern of the front metal interconnect layer contains at least another geometric feature. The at least one geometric feature and the at least another geometric feature are different. The correlation coefficient for the positive correlation between the fractional areas is less than 1 due to the differences in the modified patterns.

Other pattern manipulation operations may be performed to generate the modified patterns. For example, small pitch structures such as a set of nested metal lines may be merged such that their orientation and fractional metal area are preserved, while dimensions of features are increased. The net effect is similar to the modification of the pattern in FIG. 8(d) to the pattern in FIG. 8(e).

Figure 11B:
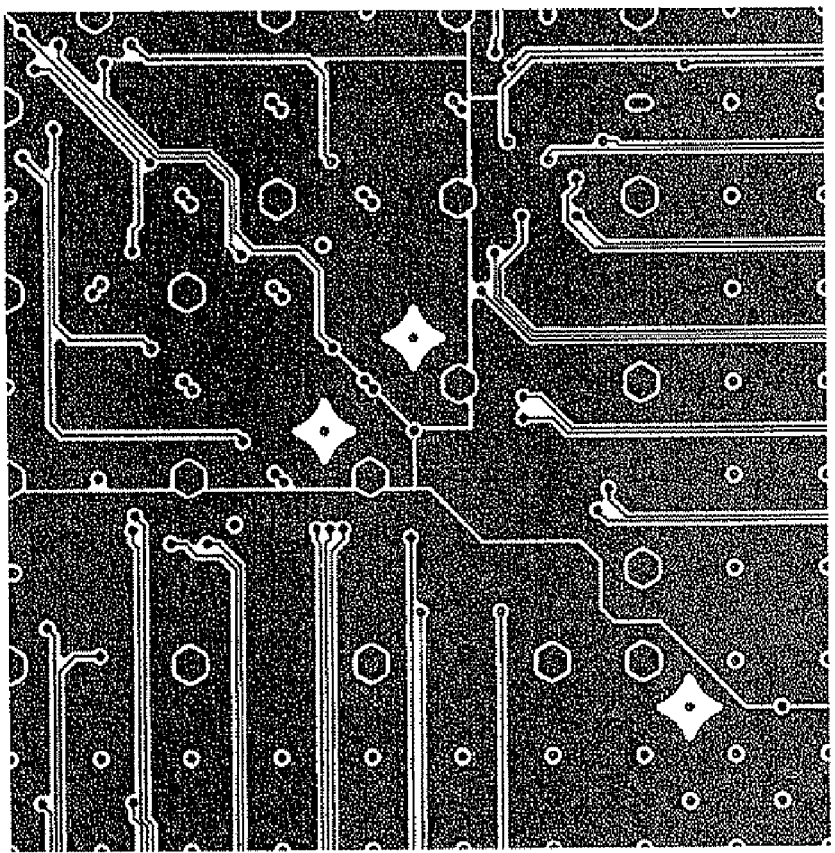
FIGS. 11(a)-11(d) show a fifth set of exemplary images of front and back metal interconnect layers.
Figure 11A:
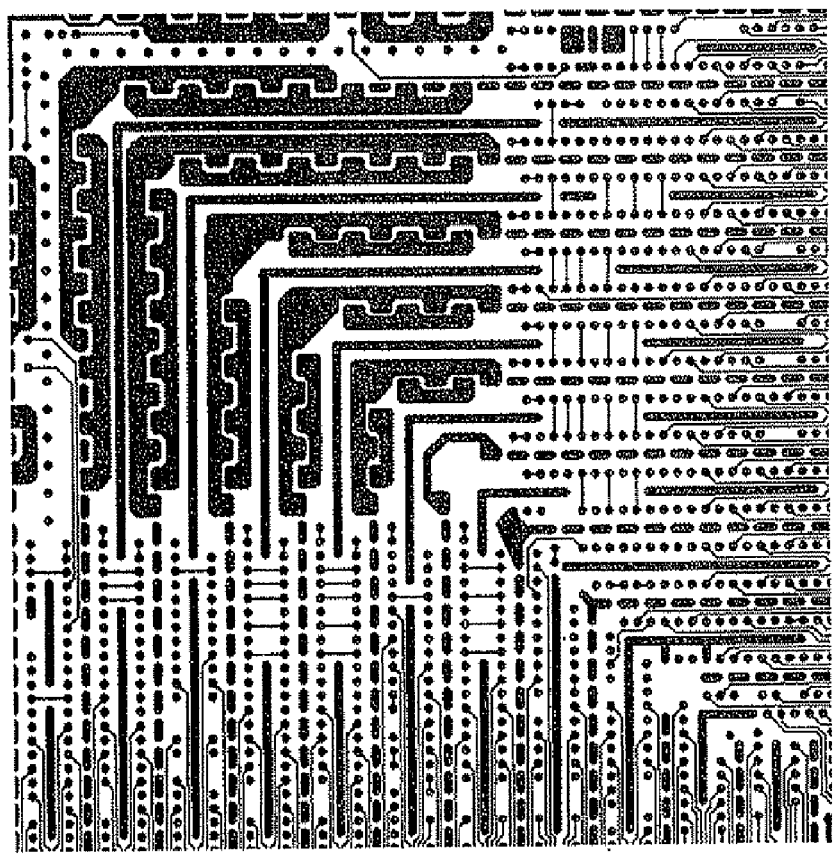

FIGS. 11(a)-11(d) show a "real-life" application of the inventive pattern-matching method to a pair of front metal interconnect layers and a back metal interconnect layer. FIG. 11(a) shows a prototype pattern for the front metal interconnect layer as designed with circuit performance considerations but without considerations for pattern matching or thermal coefficient matching. Likewise, FIG. 11(b) shows a prototype pattern for the back metal interconnect layer as designed with circuit performance considerations only. The differences in the dimensions of the features, i.e., the fine pitched structures in FIG. 11(a) versus the large patterns in FIG. 11(b), are due to differences in the density of circuit wiring between the two metal interconnect layers. Further, there is an imbalance of fractional metal area between the two metal interconnect layers. The fractional metal area of prototype pattern of the top metal interconnect layer, or the percentage of the total metal area relative to the total area of the top metal interconnect layer, is about 48% since a large fraction of the top metal interconnect layer is used for insulator areas. The fractional metal area of the prototype pattern of the bottom metal interconnect layer is about 86% since most of the available areas comprise part of a large contiguous region serving as a power supply plate. The large differences in the fractional metal areas between the prototype patterns of the top metal interconnect layer and the bottom metal interconnect layer would cause a large difference between thermal expansion coefficients in front circuit build-up layers 40 (See FIG. 6) and the back circuit build-up layers (See FIG. 6) if physical structures were built according to the prototype designs, which is the case in the prior art. Such large differences in the fractional metal areas oftentimes results in a significant warp of the packaging substrate.

Figure 11D:
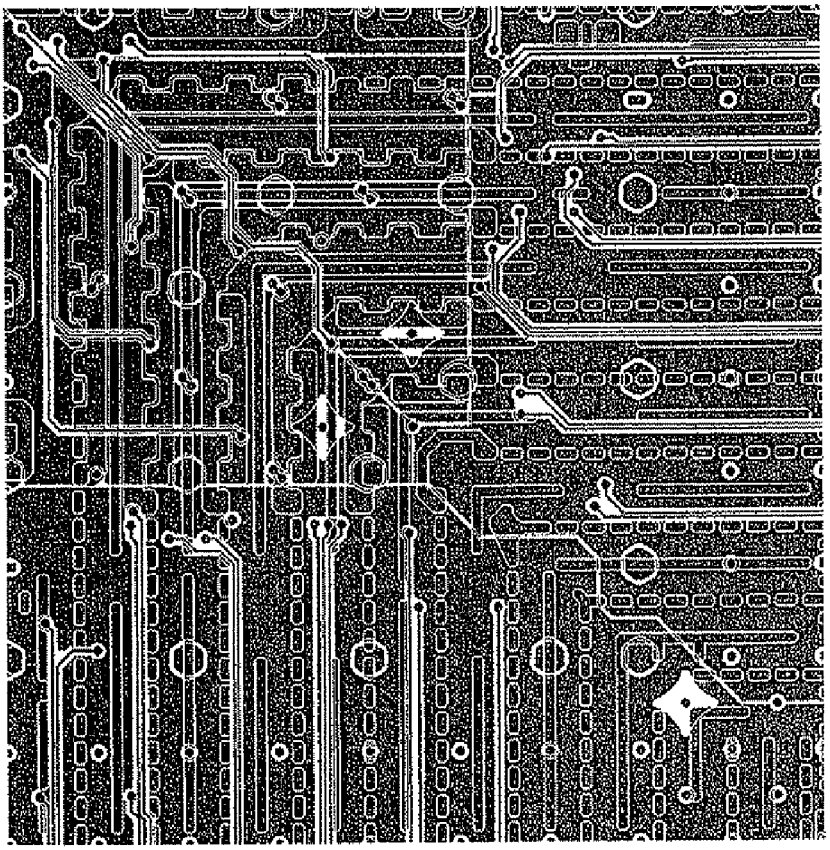
Figure 11C:
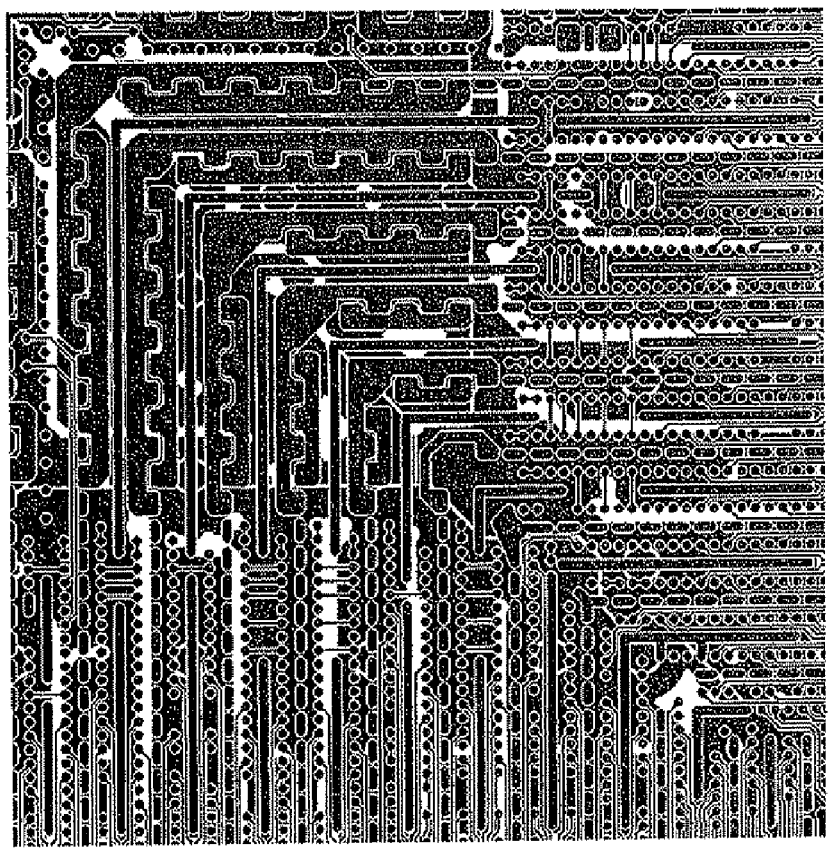

According to the present invention, the patterns in FIGS. 11(c) and 11(d) are generated employing the methods of the present invention from the prototype patterns of FIGS. 11(a) and 11(b), respectively. Thus, FIG. 11(c) is a modified pattern of the front metal interconnect layer and FIG. 11(d) is a modified pattern of the back metal interconnect layer. The average feature sizes of the two modified patterns are similar between FIGS. 11(c) and 11(d). Further, the fractional metal areas of the two modified patterns are matched. Specifically, the fractional metal area of the modified pattern of the top metal interconnect layer as shown in FIG. 11(c) is about 71%. The fractional metal area of the modified pattern of the bottom metal interconnect layer as shown in FIG. 11(d) is about 78%. The fractional metal areas are matched within 8% in this case. Thus, the mismatch of about 38% in the fractional metal areas in the prototype patterns of FIGS. 11(a) and 11(b) is reduced to less than 8% by matching the fractional metal areas in the modified patterns for the front and back metal interconnect layers of FIGS. 11(c) and 11(d). The patterns are matched without compromising the intended electrical functionality of each metal interconnect layer.

A pair of physical structures for the front metal interconnect layer and the back metal interconnect structures are manufactured employing the matched patterns for the front and back metal interconnect structures such as the patterns in FIGS. 11(c) and 11(d). The thermal expansion coefficients are matched globally between the front metal interconnect layer and the bottom interconnect layer. Further, the thermal expansion coefficients are matched region by region within corresponding subsets of areas smaller than the total area of the front or back metal interconnect layers. Thus, the present invention provides not only a global matching of average thermal expansion coefficients between the front metal interconnect layer and the back metal interconnect layer, but also region by region matching in which the local thermal expansion coefficient of a region of the front metal interconnect layer is matched to the local thermal expansion coefficient of a corresponding region of the back metal interconnect layer that underlies the region of the front metal interconnect layer.

The pattern matching may be performed for each pair of the front metal interconnect layer and the back interconnect layer having the same number of intervening layers between the core 50 (See FIG. 6) and the front or back metal interconnect layer as described above. By matching every pair of the front metal interconnect layer and the back interconnect layer, the three-dimensional distribution of coefficients of thermal expansion within the front circuit build-up layers 40 (See FIG. 6) and within the back circuit build-up layers 60 (See FIG. 6) may be mirror images of each other. In other words, the set of front circuit build-up layers 40 and the set of back circuit build-up layers 60 have a symmetric three-dimensional distribution of coefficient of thermal expansion. The mirror symmetry of the three-dimensional distribution of the coefficients of thermal expansion suppresses warp of the packaging substrates that would otherwise be triggered by thermal cycling. Enhanced resistance to warp reduces warp in packaging substrates, thereby improving yield of the packaging substrate and enabling manufacture of larger packaging substrates.

Figure 12:
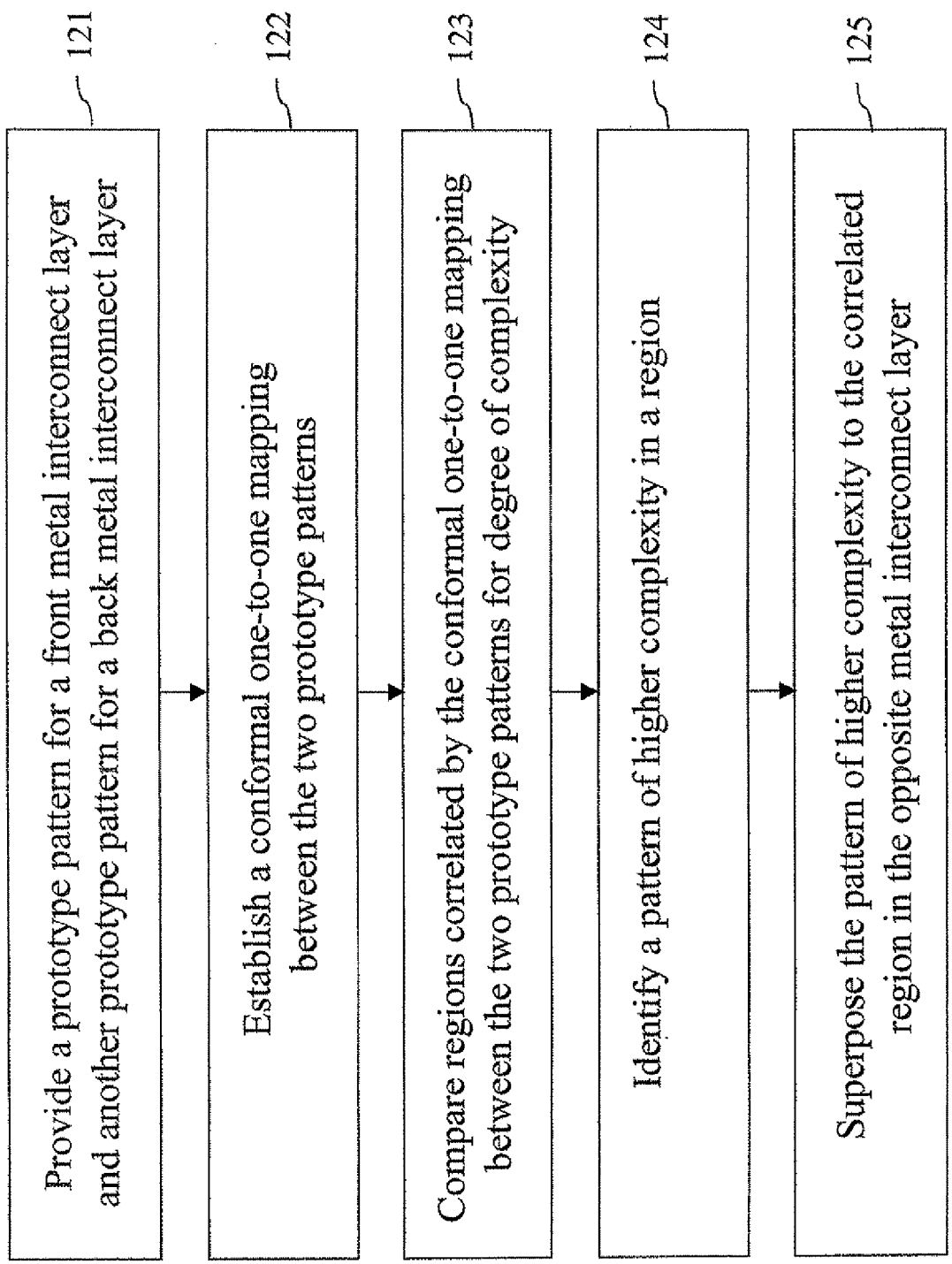
FIG. 12 is a flow chart for a method of generating a matched pair of a first pattern for a front metal interconnect layer and a second pattern for a back metal interconnect layer for a packaging substrate according to the present invention.

Referring to FIG. 12, a method of generating a matched pair of a first pattern for a front metal interconnect layer and a second pattern for a back metal interconnect layer for a packaging substrate is provided.

Referring to a first step 121 of the flow chart, a prototype pattern for a front metal interconnect layer and another prototype pattern for the back metal interconnect layer is provided. Preferably, the pair of the front metal interconnect layer and the back metal interconnect layer have the same number of intervening metal interconnect layers between the core 50 and each of the pair of the front metal interconnect layer and the back metal interconnect layer.

Referring to a second step 122 of the flow chart, a conformal one-to-one mapping is established between the two prototype patterns. The conformal one-to-one mapping may be a superposition of one of the two prototype patterns with the other of the two prototype patterns.

Each of the two prototype patterns may be subdivided into first regions in one of the two prototype patterns or second regions in the other of the two prototype patterns. In this case, each of the first regions is correlated to one of the second regions by the conformal one-to-one mapping.

Referring to a third step 123 of the flow chart, regions correlated by the conformal one-to-one mapping between the two prototype patterns are compared for degree of complexity. In case the two prototype patterns are decomposed into the first regions and the second regions, each of the correlated pairs containing one of the first regions and one of the second regions may be compared for the complexity.

Referring to a fourth step 124 of the flow chart, a pattern of higher complexity is identified in one of the correlated regions. One or a plurality of methods may be employed for identification of the pattern of the higher complexity. The identification of the pattern of the higher complexity may employ comparison of total lengths of boundaries between metal regions and insulator regions within each of the regions correlated by the conformal one-to-one mapping. Alternatively or concurrently, the identification of the pattern of the higher complexity may employ comparison of average size of shapes of metal pieces, an average size of shapes of insulator regions, total number of metal pieces, or total number of insulator regions within each of the regions correlated by the conformal one-to-one mapping.

Referring to a fifth step 125 of the flow chart, the pattern of the higher complexity in a region in one of the two prototype patterns is superposed to the a corresponding regions to generate a modified pattern in the other of the two prototype patterns.

The process of the first step 121 through the fifth step 125 may be performed to modify the patterns in both prototype patterns, and consequently, to generate a pair of modified patterns. Patterns of electrical connections are compared between pairs of locations at which vias for inter-level connection are present in each of the modified patterns and one of the first and prototype patterns out of which the modified pattern is generated. The patterns of electrical connections may be modified by introducing additional metal areas to the modified pattern.

For example, a solid block of metal or a solid block of insulator within the modified regions may become a patterned area having the same pattern as the one of the regions out of which the superposed pattern of the higher complexity is copied.

Also, a solid block of metal or a solid block of insulator within the modified regions may become a patterned area having a scaled pattern of the pattern of the higher complexity. The scaled pattern may have substantially the same metal area to insulator area ratio as the pattern of the higher complexity.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A packaging substrate for mounting a semiconductor chip, said packaging substrate comprising:
   a core comprising an organic material, silicon, or a ceramic;
   a front metal interconnect layer containing patterned pieces of metal and an insulator material and located on and above a top surface of said core; and
   a back metal interconnect layer containing patterned pieces of said metal and said insulator material and located on and below a bottom surface of said core, wherein a conformal one-to-one mapping exists between said front metal interconnect layer and said back metal interconnect layer, wherein a positive correlation exists between a pattern of said back metal interconnect layer and a pattern of said front metal interconnect layer, wherein at least one of said patterns is modified to provide a matching 3D distribution of coefficient of thermal expansion of the corresponding front and back metal interconnect layers, a probability to detect presence of the metal at a corresponding point location in said front metal interconnect layer, obtained by said conformal one-to-one mapping of a randomly selected point location in said back metal interconnect layer at which the metal is present, is greater than a ratio of a total area of metal within said front metal interconnect layer to a total area of said front metal interconnect layer.

2. The packaging substrate of claim 1, wherein a probability to detect absence of the metal at a corresponding point location in said front metal interconnect layer obtained by said conformal one-to-one mapping of another randomly selected point location in said back metal interconnect layer at which the metal is not present is greater than a ratio of a total area in which metal is not present within said front metal interconnect layer to said total area of said front metal interconnect layer.

3. The packaging substrate of claim 1, wherein said point location within said front metal interconnect layer and said point location in said back metal interconnect layer are coincidental in a superposition of a design of said front metal interconnect layer with a design of said back metal interconnect layer, and wherein said probability is less than 1.

4. The packaging substrate of claim 1, wherein said pattern of said back metal interconnect layer contains at least one geometric feature, and said pattern of said front metal interconnect layer contains at least another geometric feature, wherein said at least one geometric feature and said at least another geometric feature are different.

5. The packaging substrate of claim 1, wherein said front metal interconnect layer and said back metal interconnect layer have identical sizes.

6. The packaging substrate of claim 1, wherein said front metal interconnect layer and said back metal interconnect layer comprise a metal that is one of copper, gold, silver, and nickel.

7. The packaging substrate of claim 1, wherein said ratio of said total area of said metal within said front metal interconnect layer to said total area of said front metal interconnect layer and another ratio of a total area of the metal within said back metal interconnect layer to a total area of said back metal interconnect layer are within 30% of each other.

8. The packaging substrate of claim 7, wherein said ratio and said another ratio is within 10% of each other.

9. The packaging substrate of claim 1, wherein for a randomly selected pattern containing a contiguous piece of said metal located in a region in said back metal interconnect layer, a probability that a first ratio exceeds a second ratio is greater than 50%, wherein said first ratio is a ratio of a total area of said metal within a corresponding region of said top metal interconnect layer to a total area of said corresponding region, and wherein said second ratio is said ratio of said total area of said metal within said front metal interconnect layer to said total area of said front metal interconnect layer.

10. The packaging substrate of claim 9, wherein an entirety of boundaries of said corresponding region of said top metal interconnect layer and an entirety of boundaries of said region said back metal interconnect layer are coincidental in a superposition of a design of said front metal interconnect layer with a design of said back metal interconnect layer.

11. The packaging substrate of claim 1, wherein for a randomly selected pattern containing a contiguous region in which said metal is absent in said back metal interconnect layer, a probability that a first ratio exceeds a second ratio is greater than 50%, wherein said first ratio is a ratio of a total area in which said metal is absent within a corresponding region of said top metal interconnect layer to a total area of said corresponding region, and wherein said second ratio is a ratio of a total area in which said metal is absent within said front metal interconnect layer to said total area of said front metal interconnect layer.

12. The packaging substrate of claim 11, wherein an entirety of boundaries of said corresponding region of said top metal interconnect layer and an entirety of boundaries of said contiguous region are coincidental in a superposition of a design of said front metal interconnect layer with a design of said back metal interconnect layer.

13. A packaging substrate for mounting a semiconductor chip, said packaging substrate comprising:
a core comprising a ceramic material or an organic material;
a front metal interconnect layer containing patterned pieces of metal and an insulator material and located on and above a top surface of said core; and
a back metal interconnect layer containing patterned pieces of said metal and said insulator material and located on and below a bottom surface of said core, wherein a conformal one-to-one mapping exists between said front metal interconnect layer and said back metal interconnect layer, wherein one of said patterned pieces of metal is modified to provide a matching 3D distribution of coefficient of thermal expansion of the corresponding front and back metal interconnect layers, and wherein for a geometrical shape that may be isotropically and arbitrarily scaled in size by varying a dimension, at least one value exists for said dimension at which fractional metal areas of a pair of randomly selected regions positively correlate to each other, wherein said pair of randomly selected regions comprises a first region located in said front metal interconnect layer and a second region located in said back metal interconnect layer, wherein said first region and said second region are projected into each other by said conformal one-to-one mapping, and wherein said first region and said second region have said geometrical shape and said value for said dimension.

14. The packaging substrate of claim 13, wherein a correlation coefficient for said positive correlation is less than 1.

15. The packaging substrate of claim 13, wherein said patterned pieces of metal within of said back metal interconnect layer contains at least one geometric feature, and said patterned pieces of metal within of said front metal interconnect layer contains at least another geometric feature, wherein said at least one geometric feature and said at least another geometric feature are different.

16. The packaging substrate of claim 13, wherein said front metal interconnect layer and said back metal interconnect layer have identical sizes.

17. The packaging substrate of claim 13, wherein an entirety of boundaries of said first region and an entirety of boundaries of said second region are coincidental in a superposition of a design of said front metal interconnect layer with a design of said back metal interconnect layer.

18. A packaging substrate for mounting a semiconductor chip, said packaging substrate comprising:
a set of front circuit build-up layers located in an upper portion of said packaging substrate, wherein each of said front circuit build-up layers comprise a front metal interconnect layer and a front insulator layer; and
a set of back circuit build-up layers located in a lower portion of said packaging substrate, wherein each of said back circuit build-up layers comprise a back metal interconnect layer and a back insulator layer, at least one of said set of front build-up layers and said set of back build-up layers is modified to provide a symmetric three-dimensional distribution of coefficient of thermal expansion of the corresponding front and back build-up layers, and wherein a positive correlation exists between a pattern of said back metal interconnect layer and a pattern of said front metal interconnect layer, and wherein a probability to detect presence of the metal at a corresponding point location in said front metal interconnect layer, obtained by superposition of a randomly selected point location in said back metal interconnect layer at which the metal is present onto said front metal interconnect layer, is greater than a ratio of a total area of the metal within said front metal interconnect layer to a total area of said front metal interconnect layer.

19. The packaging substrate of claim 18, wherein said ratio of said total area of said metal within said one of said front metal interconnect layers to said total area of said one of said front metal interconnect layer and another ratio of a total area of metal within said one of said back metal interconnect layers to a total area of said one of the said back metal interconnect layers are within 30% of each other.

20. The packaging substrate of claim 18, wherein a positive correlation exists between a pattern of said back metal interconnect layer and a pattern of said front metal interconnect layer, and wherein a probability to detect absence of the metal at a corresponding point location in said front metal interconnect layer, obtained by superposition of a randomly selected point location in said back metal interconnect layer at which the metal is not present onto said front metal interconnect layer, is greater than a ratio of a total area in which the metal is not present within said front metal interconnect layer to a total area of said front metal interconnect layer.

21. The packaging substrate of claim 18, wherein for a randomly selected pattern containing a contiguous piece of said metal located in a region in said one of said back metal interconnect layers, a probability that a first ratio exceeds a second ratio is greater than 50%, wherein said first ratio is a ratio of a total area of said metal within a corresponding region of said one of top metal interconnect layers to a total area of said corresponding region, and wherein said second ratio is said ratio of said total area of said metal within said one of said front metal interconnect layers to said total area of said one of said front metal interconnect layers, and wherein an entirety of boundaries of said corresponding region and an entirety of boundaries of said region are coincidental in a superposition of a design of said front metal interconnect layer with a design of said back metal interconnect layer.

* * * * *